(12) United States Patent
Okunuki

(10) Patent No.: US 6,912,239 B2
(45) Date of Patent: Jun. 28, 2005

(54) DISTRIBUTED FEEDBACK LASER DEVICE

(75) Inventor: Yuichiro Okunuki, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 44 days.

(21) Appl. No.: 10/206,217

(22) Filed: Jul. 29, 2002

(65) Prior Publication Data

US 2003/0152126 A1 Aug. 14, 2003

(30) Foreign Application Priority Data

Feb. 12, 2002 (JP) .................................... 2002-033607

(51) Int. Cl.[7] .............................................. H01S 3/08
(52) U.S. Cl. ........................... 372/96; 372/19; 372/27; 372/28; 372/45; 372/46; 372/47; 372/48; 372/49; 372/50; 372/96; 372/102
(58) Field of Search ............................. 372/19, 27, 28, 372/45–50, 96, 102

(56) References Cited

U.S. PATENT DOCUMENTS

| | | | | | |
|---|---|---|---|---|---|
| 5,177,758 | A | * | 1/1993 | Oka et al. .................... | 372/50 |
| 5,292,685 | A | * | 3/1994 | Inoguchi et al. ............. | 438/32 |
| 5,295,150 | A | * | 3/1994 | Vangieson et al. ........... | 372/96 |
| 5,613,020 | A | * | 3/1997 | Uchida et al. ................ | 385/9 |
| 5,619,523 | A | * | 4/1997 | Connolly et al. ............. | 372/96 |
| 6,008,675 | A | * | 12/1999 | Handa ......................... | 327/96 |
| 6,337,868 | B1 | * | 1/2002 | Mizutani ..................... | 372/27 |

FOREIGN PATENT DOCUMENTS

JP        2000-114652        4/2000

OTHER PUBLICATIONS

A. Takemoto et al., "1.3–μm Distributed Feedback Laser Diode with a Grating Accurately Controlled by a New Fabrication Technique", vol. 7, No. 12 (Dec. 1989).
Yasunori Miyazaki et al., "Eye–Opening Improved Electro-absorption Modulator/DFB Laser Diode with Optimized Thickness of the Separate–Confinement Heterostruction Layers", vol. 36, No. 8 (Aug. 2000).
T. Takiguchi et al., "English Translation of Extended Abstracts of 62nd Scientific Lecture Meeting of the Japan Society of Applied Physics", (Sep. 2001 at Aichi Institute of Technology).

* cited by examiner

Primary Examiner—Don Wong
Assistant Examiner—Delma R. Flores Ruiz
(74) Attorney, Agent, or Firm—Leydig, Voit & Mayer, Ltd.

(57) ABSTRACT

A distributed feedback laser device inhibiting beam coupling coefficient variation resulting from fabrication dispersion and improving fabrication yield. The distributed feedback laser device includes cladding layers provided on an InP substrate and located on both sides of an active layer and a diffraction grating having grating bars, different in refractive index from the cladding layers, in either cladding layer and extending in a direction perpendicular to a light emission direction at a prescribed pitch in the emission direction, as well as at least one light distribution control layer, located in the cladding layer, spaced from the diffraction grating and having the same composition as the diffraction grating.

19 Claims, 18 Drawing Sheets

FIG.37 PRIOR ART
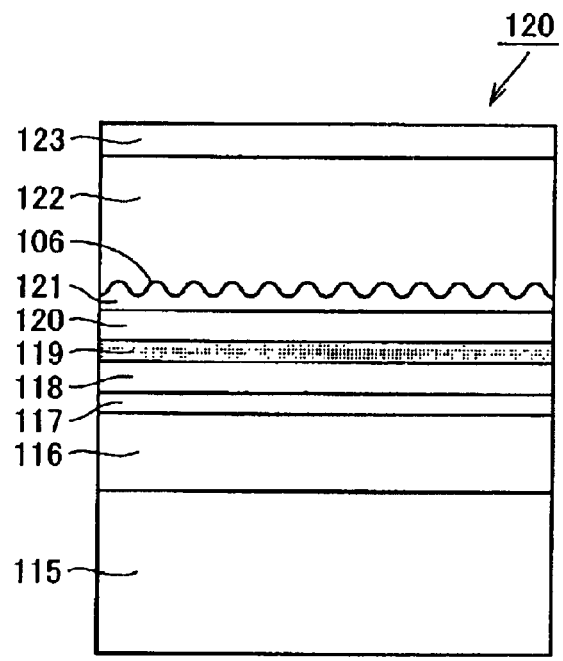
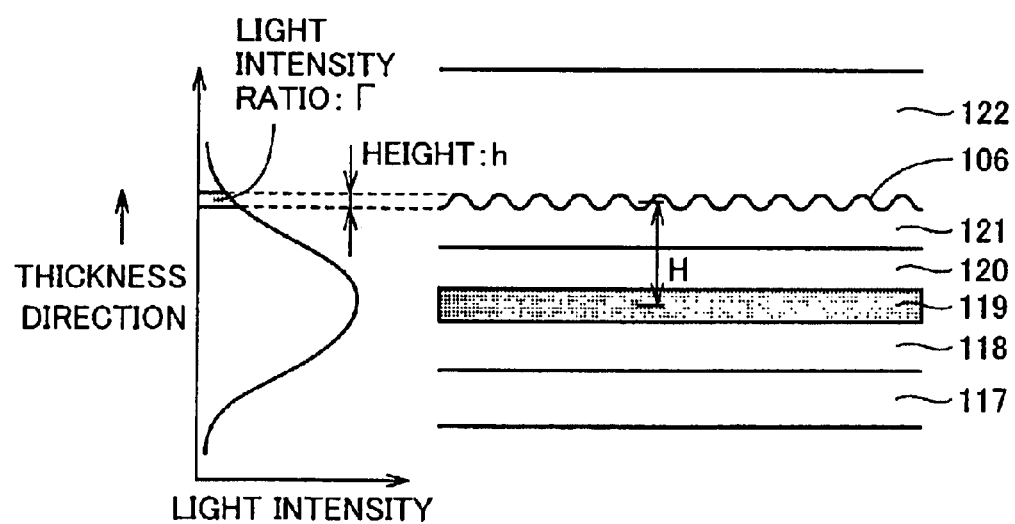
FIG.38B PRIOR ART  FIG.38A PRIOR ART

DEVIATION OF BEAM COUPLING COEFFICIENT FROM DESIGN VALUE

DEVIATION OF THICKNESS FROM DESIGN VALUE

DEVIATION OF BEAM COUPLING COEFFICIENT FROM DESIGN VALUE

DEVIATION OF REFRACTIVE INDEX FROM DESIGN VALUE

DISTRIBUTED FEEDBACK LASER DEVICE

BACKGROUND OF THE INVENTION

1. Field of the Invention

The present invention relates to a distributed feedback laser device mainly employed for optical fiber communication.

2. Description of the Background Art

A distributed feedback laser device employed for optical fiber communication has a diffraction grating in a cavity and oscillates at an oscillation wavelength corresponding to the cycle of this diffraction grating, thereby stably operating in a single vertical mode also in high-speed modulation. Therefore, the distributed feedback laser device is generally employed for optical fiber communication over a long distance or at a high bit rate. One of parameters remarkably influencing the characteristics of the distributed feedback laser device is a beam coupling coefficient. This parameter remarkably influences not only static characteristics such as the threshold current and slope efficiency of the laser device but also noise and dynamic characteristics.

For example, FIGS. 37, 38A and 38B show a conventional distributed feedback laser device 120 disclosed in Japanese Patent Laying-Open No. 2000-114652. In this distributed feedback laser device 120, (1) an n-conductivity type InP cladding layer 116, (2) InGaAsP light trap layers 117 and 118, (3) an active layer 119, (4) InGaAsP light trap layers 120 and 121, (5) a diffraction grating 106, (6) a p-conductivity type InP cladding layer 122 and (7) a p-conductivity type InGaAs contact layer 123 are successively stacked on an n-conductivity type InP substrate 115 in ascending order.

Light intensity of a laser beam oscillated from the distributed feedback laser device 120 along the thickness direction shown in FIG. 38A spreads vertically about the active layer 119, as shown in FIG. 38B. As shown in FIGS. 38A and 38B, the light intensity strongly depends on the height h of the diffraction grating 106, i.e., the amplitude of waves, and the distance H between the diffraction grating 106 and the active layer 119.

However, the height h of the diffraction grating 106 remarkably varies with dispersion in etching depth for forming the diffraction grating 106 etc. The diffraction grating 106 is etched by etching a small region of about 0.2 μm in width. Therefore, the etching rate is remarkably dispersed in the wafer plane with remarkable variation with fabrication, i.e., run-to-run variation. Consequently, the beam coupling coefficient varies with the magnitude of dispersion of the height h of the diffraction grating 106. In practice, further, influence is also exerted by thickness dispersion in crystal growth. If the LnGaAsP light trap layers 120 and 121, 118 and 120 or 117 and 121 are increased in thickness, for example, the distance H between the diffraction grating 106 and the active layer 119 is increased. Therefore, light intensity overlapping with the diffraction grating 106 is reduced to reduce the beam coupling coefficient. Thus, the beam coupling coefficient is remarkably dispersed in the distributed feedback laser device 120 shown in FIG. 37 due to small thickness variation in fabrication or refractive index variation resulting from composition variation, and it is difficult to fabricate the distributed feedback laser device 120 with an excellent yield.

FIG. 39 shows another conventional distributed feedback laser device 120 not influenced by the aforementioned dispersion of the height h of the diffraction grating disclosed in Journal of Lightwave Technology, Vol. 7 (1989), pp. 2072–2077, for example. In this distributed feedback laser device 120, (1) an InP cladding layer 122a, (2) an active layer, (3) an InP cladding layer 122b, (4) a diffraction grating 106 and (5) an InP cladding layer 122c are successively stacked on an InP substrate 115 in ascending order. The beam coupling coefficient of the distributed feedback laser device 120 shown n FIG. 39 is decided by two thicknesses $d_{InP}$ (the thickness of the InP cladding layer 122b) and $d_{grating}$, the refractive index of the diffraction grating 106 and the sectional shape of the diffraction grating 106. When the aforementioned diffraction grating 106 has grating bars arranged at a prescribed pitch, therefore, the beam coupling coefficient does not depend on the aforementioned etching depth. Therefore, the distributed feedback laser device 120 has no factor corresponding to the height h of the diffraction grating 106, the main factor for dispersion of the beam coupling coefficient in the distributed feedback laser device 120 shown in FIG. 37. Thus, dispersion of the beam coupling coefficient in the distributed feedback laser device 120 shown in FIG. 39 is smaller than that in the distributed feedback laser device 120 shown in FIG. 37.

However, the thicknesses and the refractive index decided in film forming steps are strongly influenced by dispersion of growth rates in film forming apparatuses, compositions at film forming opportunities and in-plane distribution of growth rates and compositions specific to the film forming apparatuses. The beam coupling coefficient is dispersed at film growth opportunities and in the wafer plane due to influence exerted by the aforementioned dispersion.

In the following description, the wording "film forming" includes both of (g1) a case of growing an epitaxial film matching with an underlayer film in crystal orientation and (g2) a case of forming a crystal film or an amorphous film with no regard to matching in crystal orientation. The latter case (g2) corresponds to deposition of a polycrystalline film or the like.

FIG. 40 shows results of calculation of deviation of the beam coupling coefficient from a design value resulting from variation of the thickness $d_{InP}$. FIG. 41 shows results of calculation of deviation of the beam coupling coefficient from the design value resulting from variation of the thickness $d_{grating}$. FIG. 42 shows results of calculation of deviation of the beam coupling coefficient from the design value resulting from deviation of the refractive index of the diffraction grating. It is understood from these results of calculation that the beam coupling coefficient varies by ±14 to 25% due to thickness variation of ±25% or refractive index variation of 1%. The characteristics of the conventional distributed feedback laser device are remarkably dispersed due to such dispersion of the beam coupling coefficient, to hinder improvement of the fabrication yield.

SUMMARY OF THE INVENTION

An object of the present invention is to provide a distributed feedback laser device capable of improving the fabrication yield by inhibiting a beam coupling coefficient from variation resulting from dispersion between film forming opportunities, dispersion between film forming apparatuses and dispersion in a wafer plane.

The distributed feedback laser device according to the present invention is a laser oscillator comprising cladding layers provided on a semiconductor substrate and located on both sides of an active layer and a diffraction grating having grating bars, different in refractive index from the cladding layers, provided in either cladding layer to extend in a direction perpendicular to a light emission direction at a prescribed pitch in the emission direction. This laser oscillator comprises at least one light distribution control layer, located in the cladding layer apart from the diffraction grating, having the same composition as the diffraction grating.

When the light distribution control layer is formed before formation of the diffraction grating, a film for defining the diffraction grating and the light distribution control layer are formed in the same film forming apparatus. In this case, the diffraction grating and the light distribution control layer formed in the film forming apparatus exhibit the same dispersion trends of thicknesses and compositions. The grating bars of the diffraction grating and the light distribution control layer have higher refractive indices as compared with the cladding layers or the like. Therefore, if the diffraction grating is thickly formed with no arrangement of the light distribution control layer, for example, an electric field of light and the diffraction grating remarkably overlap with each other to increase the beam coupling coefficient.

However, the light distribution control layer formed in the aforementioned film forming apparatus is dispersed in the same trend as the film for defining the diffraction grating, and hence increased in thickness. Light is attracted to a region having a large refractive index, and hence field strength distribution of light is attracted to the aforementioned light distribution control layer increased in thickness and separated from the diffraction grating beyond distribution in design. Consequently, increase/decrease of the beam coupling coefficient canceled and the beam coupling coefficient is inhibited from variation.

When formed after formation of the diffraction grating, the light distribution control layer is prepared in the same dispersion trend as the film for defining the diffraction grating in the film forming apparatus employed for forming the film for defining the diffraction grating. Also in this case, therefore, increase/decrease of the beam coupling coefficient is canceled and the beam coupling coefficient is inhibited from variation, similarly to the above.

The term "diffraction grating", indicating the diffraction grating itself in general, may also indicate a layer formed with the diffraction grating. A term "diffraction grating film" employed in description of a fabrication method or the like indicates a film for defining the diffraction grating.

The light distribution control layer and the diffraction grating may have the same composition either inclusive of or exclusive of impurities deciding conductivity types. When the impurities deciding the conductivity types are different from each other, either the light distribution control layer or the diffraction grating contains an n-conductivity type impurity and the remaining one contains a p-type conductivity type in general, for example. This also applies to the following description.

The method of fabricating a distributed feedback laser device according to the present invention is employed for fabricating a distributed feedback laser device having cladding layers located on both sides of an active layer provided on a semiconductor substrate, a diffraction grating having grating bars, different in refractive index from the cladding layers, provided in either cladding layer to extend in a direction perpendicular to a light emission direction at a prescribed pitch in the emission direction and at least one light distribution control layer, located in the cladding layer apart from the diffraction grating, having the same composition as the diffraction grating. According to this method, at least one light distribution control layer and a film defining the diffraction grating are formed in any of (a1) the same film forming apparatus, (a2) film forming apparatuses similar in in-plane distribution of thicknesses to each other and (a3) film forming apparatuses of the same structure.

According to this method, dispersion trends of the light distribution control layer and the diffraction grating film can be equalized with each other. Therefore, variation factors, resulting from dispersion in fabrication, influencing the beam coupling coefficient can be rendered conflict with each other and hence canceled. Consequently, the beam coupling coefficient can be inhibited from variation resulting from dispersion in fabrication and the yield can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 37 illustrates a conventional distributed feedback laser device;

FIG. 38A illustrates that the distance between an active layer and a diffraction grating influences a beam coupling coefficient, and FIG. 38B illustrates that the height of an undulated diffraction grating influences the beam coupling coefficient;

DESCRIPTION OF THE PREFERRED EMBODIMENTS

Embodiments of the present invention are now described with reference to the drawings.

(First Embodiment)

Figure 1:
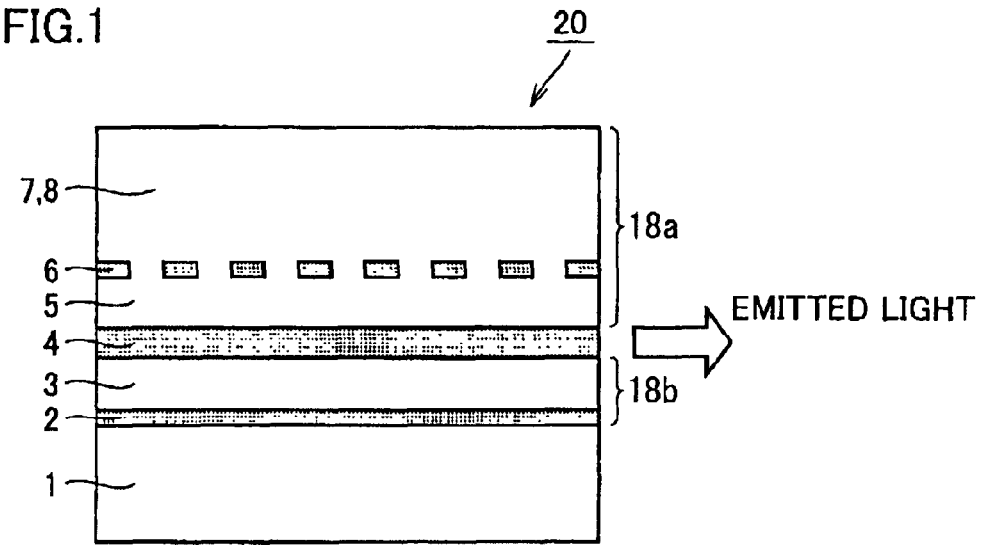
FIG. 1 illustrates a distributed feedback laser device according to a first embodiment of the present invention.

Referring to FIG. 1, an n-conductivity type InGaAsP layer 2 is located on an n-conductivity type InP substrate 1 and an n-conductivity type InP layer 3 is provided on the InGaAsP layer 2 in a distributed feedback laser device according to a first embodiment of the present invention. An InGaAsP layer forming an active layer 4 is located on the n-conductivity type InP layer 3, a p-conductivity type InP layer 5 is provided on the active layer 4, and a diffraction grating 6, having grating bars consisting of n-conductivity type InGaAsP arranged at a prescribed pitch, is located on the p-conductivity type InP layer 5. P-conductivity type InP layers 7 and 8 are provided to fill up grooves between the grating bars.

Cladding layers 18a and 18b of InP hold the active layer 4 from above and from below respectively. The aforementioned n-conductivity type InGaAsP layer 2 defines a light distribution control layer. As shown in FIG. 1, the cladding layer 18b is arranged in contact with the upper portion of the light distribution control layer 2 located in contact with the n-conductivity type InP substrate 1. Also when the cladding layer 18b is located in contact with the upper portion of the light distribution control layer 2 located in contact with the semiconductor substrate 1, the light distribution control layer 2 is described as located in the cladding layer 18b, which is identical in composition to the semiconductor substrate 1. In other words, the light distribution control layer 2 held between the cladding layer 18b of InP and the semiconductor substrate 1 of InP can be regarded as substantially arranged in the cladding layer 18b.

In the following description, the diffraction grating 6 and a diffraction grating film for defining the diffraction grating 6 are denoted by the same reference numeral.

This distributed feedback laser device injects a current into the active layer 4 for making oscillation along the active layer 4 while selecting a specific wavelength through the pitch of the grating bars forming the diffraction grating 6 for continuing oscillation at the specific wavelength. As shown in FIG. 1, the distributed feedback laser device partially extracts a light component from the light in oscillation and employs the same for optical fiber communication or the like.

Figure 2:
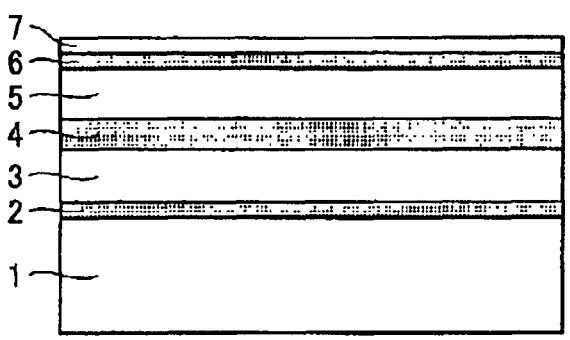
FIG. 2 illustrates a state forming a cladding film on a diffraction grating film in a method of fabricating the distributed feedback laser device shown in FIG. 1.
Figure 3:
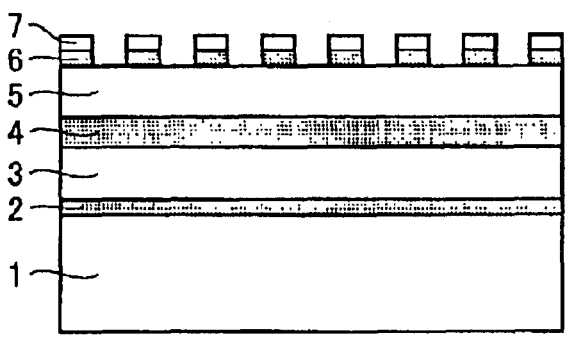
FIG. 3 illustrates a state forming a diffraction grating by patterning the diffraction grating film and the cladding film.

A method of fabricating the aforementioned distributed feedback laser device is now described. As shown in FIG. 2, (1) the n-conductivity type InGaAsP layer 2 defining the light distribution control layer 2, (2) the n-conductivity type InP layer 3, (3) the active layer 4 of InGaAsP, (4) the p-conductivity type InP layer 5, (5) an n-conductivity type InGaAsP film 6 for defining the diffraction grating 6 and (6) the p-conductivity type InP layer 7 are successively formed on the n-conductivity type InP substrate 1 in ascending order.

In such film formation, it is important that at least the n-conductivity type InGaAsP layer 2 defining the light distribution control layer 2 and the n-conductivity type InGaAsP film 6 defining the diffraction grating 6 must be formed in apparatuses having the same dispersion trend at an opportunity keeping the dispersion trend unchanged, e.g., at the same opportunity. When InP wafers are batch-processed one by one, for example, the n-conductivity type InGaAsP layer 2 defining the light distribution control layer 2 and the n-conductivity type InGaAsP film 6 defining the diffraction grating 6 must be continuously formed in the same film forming apparatus. The term "the same dispersion trend" indicates that dispersion is caused in the same direction at the same degree of magnitude. In relation to in-plane dispersion, the aforementioned term indicates that dispersion is caused in similar in-plane distribution inclusive of the dispersive direction.

MOCVD (metal organic chemical vapor deposition), MBE (molecular beam epitaxy) or LPE (liquid phase epitaxy) can be employed for the aforementioned film formation.

Thereafter the n-conductivity type InGaAsP film 6 and the p-conductivity type InP layer 7 are patterned by interference exposure, electron beam exposure and etching for forming the grating bars of the prescribed pitch. Then, the p-conductivity type InP layer 8 is formed thereon to fill up the grooves between the grating bars, thereby completing the distributed feedback laser device.

In the aforementioned structure of the distributed feedback laser device shown in FIG. 1, the n-conductivity type InGaAsP layer 2 defining the light distribution control layer 2 is identical in composition, including the impurity deciding the conductivity type, as the n-conductivity type InGaAsP film 6 forming the grating bars of the diffraction grating 6. As hereinabove described, these layers 2 and 6 are continuously formed at the same opportunity in the same apparatus, to exhibit the same dispersion trends as to the thicknesses and the compositions. Therefore, the refractive indices of these layers 2 and 6 deviate from design values substantially in the same ratios. When the InGaAsP layer 6 defining the diffraction grating 6 is increased in thickness, for example, overlapping between the diffraction grating 6 and oscillation field distribution is increased to increase the beam coupling coefficient in the conventional distributed feedback laser device. According to this embodiment, however, the InGaAsP layer 2 defining the light distribution control layer 2 is also increased in thickness with respect to a design value in a trend and a ratio similar to those of the InGaAsP film 6 defining the diffraction grating 6.

Figure 4:
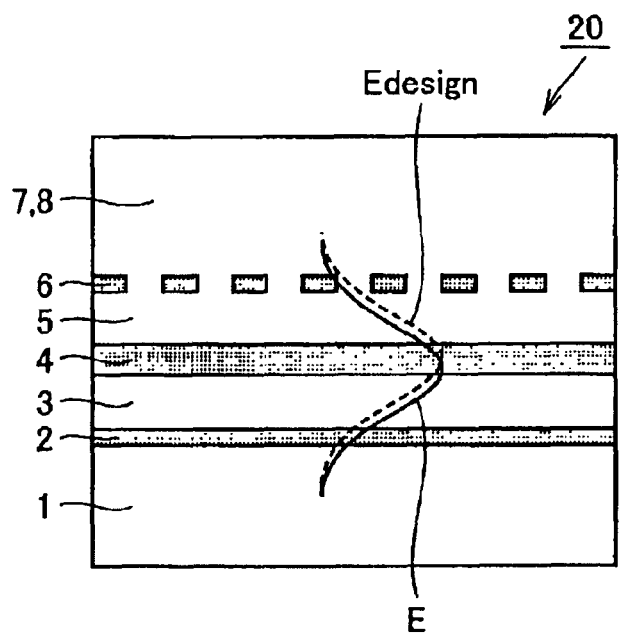
FIG. 4 illustrates that field strength distribution of light deviates to separate from the diffraction grating when the diffraction grating film is dispersed to be increased in thickness.

Light is attracted to a region having a high refractive index, and hence field strength distribution of the light is attracted to the light distribution control layer 2 from a designed position of oscillation due to the thickness of the light distribution control layer 2 dispersed to be increased. FIG. 4 illustrates that the aforementioned InGaAsP layer 2 defining the light distribution control layer 2 is increased in thickness to attract the field strength distribution of the light in a section along the waveguide thickness. Referring to FIG. 4, the broken line shows designed field strength distribution $E_{design}$, and the solid line shows field strength distribution E observed after the light distribution control layer 2 is increased in thickness due to distribution. The aforementioned deviation of the field strength distribution of the light acts to reduce the beam coupling coefficient. Consequently, thickness variation in the light distribution control layer 2, having the same trend as that in the diffraction grating film 6, can compensate for variation of the beam coupling coefficient resulting from thickness variation in the diffraction grating 6.

Figure 5:
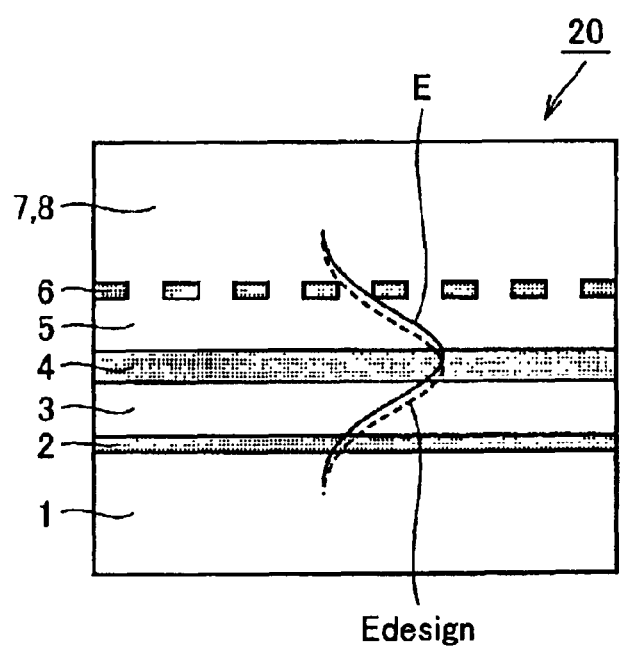
FIG. 5 illustrates that field strength distribution of light deviates to approach to the diffraction grating when the diffraction grating film is dispersed to be reduced in thickness.

When the InGaAsP film 6 defining the diffraction grating 6 is reduced in thickness, the InGaAsP layer 2 defining the light distribution control layer 2 is also dispersed in the same trend and reduced in thickness. At this time, the same mechanism as that shown in FIG. 4 acts to compensate for variation of the beam coupling coefficient. In other words, the field strength distribution of the light along the direction of the waveguide thickness is attracted to the level E beyond the level $E_{design}$ due to the reduced thickness of the light distribution control layer 2, as shown in FIG. 5. In other words, the field strength distribution is repelled from the light distribution control layer 2 beyond the designed level $E_{design}$, and attracted to the diffraction grating 6.

While the above description has been made with respect to only thickness variation, the light distribution control layer 2 also compensates for refractive index fluctuation resulting from composition variation of the InGaAsP layer 6 forming the grating bars of the diffraction grating 6, thereby compensating for variation of the beam coupling coefficient as a result.

Also when the layer 6 defining the diffraction grating 6 has composition variation or thickness variation, the beam coupling coefficient can be inhibited from variation resulting from such variation, as hereinabove described. This is summarized as follows:

(1) The light distribution control layer having the same composition as the diffraction grating is arranged to hold the active layer between the same and the diffraction grating.

(2) The distributed feedback laser device is designed to include this arrangement of the light distribution control layer.

(3) When the diffraction grating film causes thickness variation or composition variation in fabrication of the distributed feedback laser device, the light distribution control layer also causes thickness variation or composition variation of the same trend. In order to cause thickness variation or composition variation of the same trend in the diffraction grating film and the light distribution control layer, the diffraction grating film and the light distribution control layer are formed in film forming apparatuses exhibiting the same dispersion trend. For example, the diffraction grating film and the light distribution control layer are preferably continuously formed in the same film forming apparatus in the same batch processing. When the diffraction grating film and the light distribution control layer are formed through a process of etching the diffraction grating film, the diffraction grating film and the light distribution control layer cannot be continuously formed in the same film forming apparatus. However, the diffraction grating film and the light distribution control layer are preferably formed in the same film forming apparatus or at least in film forming apparatuses exhibiting similar dispersion trends.

(4) Variation of the beam coupling coefficient resulting from thickness variation or composition variation of the diffraction grating and that resulting from thickness variation or composition variation of the light distribution control layer cancel with each other, and the beam coupling coefficient is inhibited from variation. Consequently, the distributed feedback laser device can be inhibited from characteristic dispersion and improved in yield.

Figure 6:
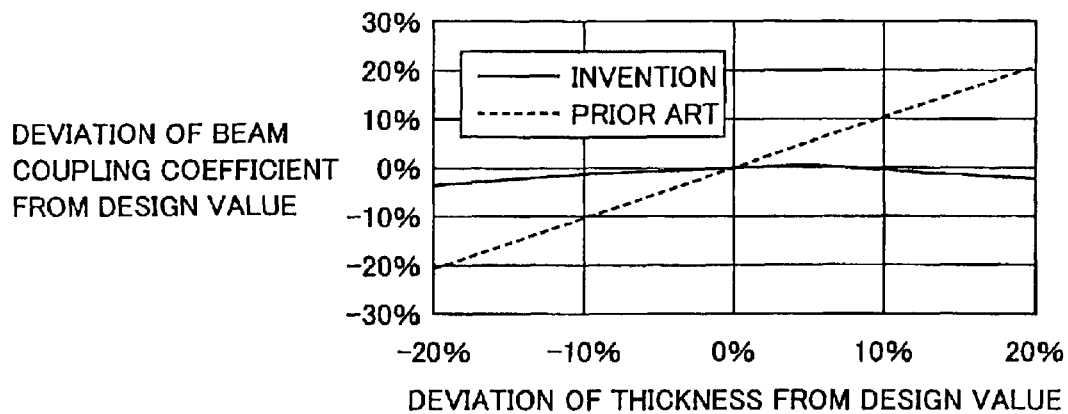
FIG. 6 illustrates deviation of beam coupling coefficients from design values upon thickness variation of the diffraction grating in the distributed feedback laser device shown in FIG. 1.
Figure 7:
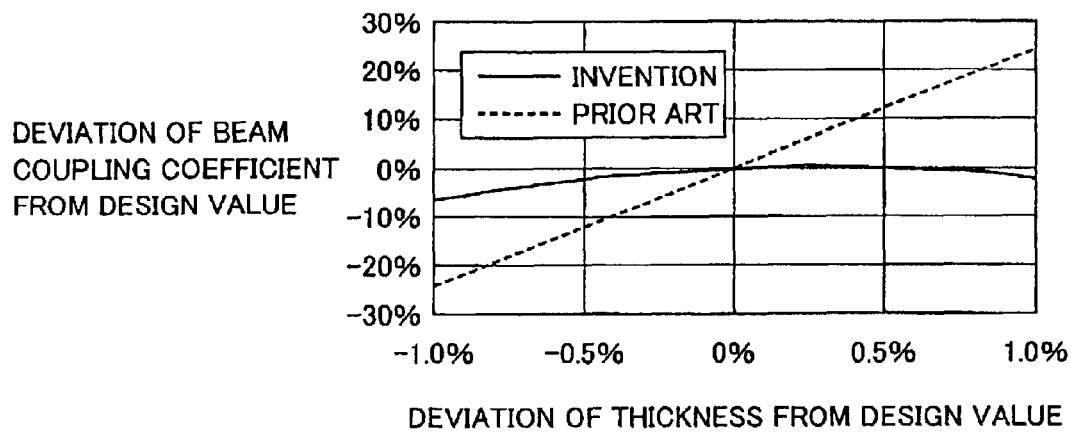
FIG. 7 illustrates deviation of beam coupling coefficients from design values upon refractive index variation of the diffraction grating in the distributed feedback laser device shown in FIG. 1.

FIG. 6 illustrates deviation of beam coupling coefficients from design values upon thickness variation of the diffraction grating in the distributed feedback laser device according to the present invention. FIG. 7 illustrates deviation of beam coupling coefficients from design values upon refractive index variation of the diffraction grating in the distributed feedback laser device according to the present invention. According to FIGS. 6 and 7, variation of the beam coupling coefficient is suppressed in the inventive distributed feedback laser device to about ⅛ as compared with the prior art. Consequently, the distributed feedback laser device can be inhibited from characteristic dispersion.

While the diffraction grating 6 is arranged on the active layer 4 according to the first embodiment, the diffraction grating 6 may alternatively be located under the active layer 4. The n- and p-conductivity types of the semiconductor layers may be inverted. The diffraction grating 6 may have one or a plurality of phase shift parts. A cavity of the diffraction grating 6 may be provided with phase shift corresponding to ¼ the in-medium wavelength and nonreflective coating at the center and on both ends respectively. The single vertical mode yield can be improved due to the phase shift and the nonreflective coating.

While the first embodiment has been described with reference to an InP/InGaAsP-based distributed feedback laser device, the present invention is also applicable to an InP/AlGaInAs-based distributed feedback laser device ($62^{nd}$ Scientific Lecture Meeting of the Japan Society of Applied Physics (2001) 13p-B-15), for example. Further, the present invention is also applicable to a distributed feedback laser device in a device prepared by monolithically integrating a modulator and the distributed feedback laser device on a common substrate (IEEE Journal of Quantum Electronics, Vol. 36 (2000) pp. 909–915), for example.

(Second Embodiment)

Figure 8:
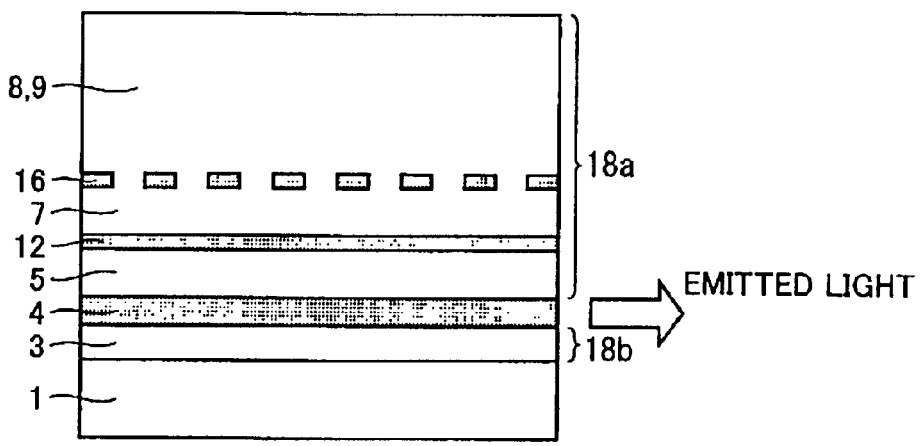
FIG. 8 illustrates a distributed feedback laser device according to a second embodiment of the present invention.

The feature of a distributed feedback laser device according to a second embodiment of the present invention resides in that a light distribution control layer 12 is arranged between a diffraction grating 16 and an active layer 4, as shown in FIG. 8. Referring to FIG. 8, the light distribution control layer 12 and the diffraction grating 16 are arranged in a cladding layer 18a.

Referring to FIG. 8, an n-conductivity type InP layer 3 is located on an n-conductivity type InP substrate 1, an InGaAsP layer 4 defining the active layer 4 is provided on the n-conductivity type InP layer 3, and a p-conductivity type InP layer 5 is located on the InGaAsP layer 5. A p-conductivity type InGaAsP layer 12 defining the light distribution control layer 12 is located on the p-conductivity type InP layer 5, and a p-conductivity type InP layer 7 is provided on the p-conductivity type InGaAsP layer 12. Further, p-conductivity type InGaAsP layers 16 forming grating bars of the diffraction grating 16 are arranged. P-conductivity type InP layers 8 and 9 are arranged to cover the p-conductivity type InGaAsP layers 16. The p-conductivity type InGaAsP layers 16 forming the grating bars of the diffraction grating 16 and the p-conductivity type InGaAsP layer 12 defining the light distribution control layer 12 are identical in composition, including the impurity defining the conductivity type, to each other.

This distributed feedback laser device injects a current into the active layer 4 for making oscillation along the active layer 4 while selecting a prescribed wavelength through the grating bars forming the diffraction grating 16 at a prescribed pitch for continuing oscillation at the specific wavelength. As shown in FIG. 8, the distributed feedback laser device partially extracts a light component from the light in oscillation and employs the same for optical fiber communication or the like.

Figure 9:
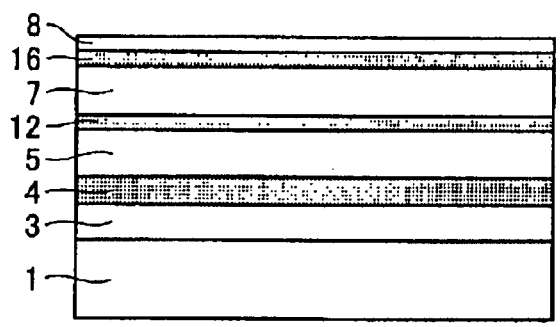
FIG. 9 illustrates a state forming a cladding film on a diffraction grating film in a method of fabricating the distributed feedback laser device shown in FIG. 8.

A method of fabricating the aforementioned distributed feedback laser device is now described. As shown in FIG. 9, (1) the n-conductivity type InP layer 3, (2) the active layer 4 of InGaAsP, (3) the p-conductivity type InP layer 5, (4) the p-conductivity type InGaAsP layer 12 defining the light distribution control layer 12, (5) the p-conductivity type InP layer 7, (6) the p-conductivity type InGaAsP films 16 defining the diffraction grating 16 and (7) the p-conductivity type InP layer 8 are successively formed on the n-conductivity type InP substrate 1 in ascending order.

In such film formation, it is important that at least the p-conductivity type InGaAsP layer 12 defining the light distribution control layer 12 and the p-conductivity type InGaAsP films 16 defining the diffraction grating 16 must be formed in film forming apparatuses having the same dispersion trend at opportunities keeping the dispersion trend unchanged, such as the same opportunity, for example. In order to batch-process InP wafers one by one, for example, the n-conductivity type InGaAsP layer 12 defining the light distribution control layer 12 and the n-conductivity type InGaAsP films 16 defining the diffraction grating 16 must be continuously formed on each InP wafer in the same film forming apparatus. The term "the same dispersion trend" indicates that dispersion is caused in the same direction at the same degree of magnitude. In relation to in-plane dispersion, the term indicates that dispersion is caused in similar in-plane distribution inclusive of the dispersive direction.

MOCVD (metal organic chemical vapor deposition), MBE (molecular beam epitaxy) or LPE (liquid phase epitaxy) can be employed for the aforementioned film formation.

Figure 10:
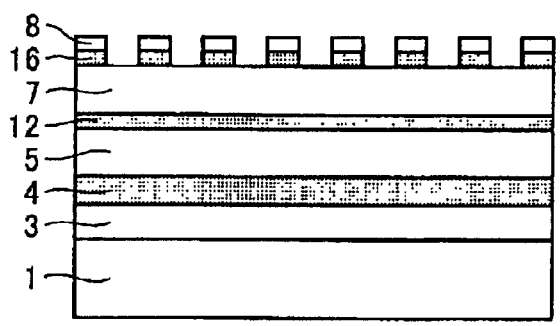
FIG. 10 illustrates a state forming a diffraction grating by patterning the diffraction grating film and the cladding film.

Thereafter the p-conductivity type InGaAsP layers 16 and the p-conductivity type InP layer 8 are patterned by interference exposure, electron beam exposure and etching for forming the grating bars at the prescribed pitch, as shown in FIG. 10. The p-conductivity type InP layer 9 is formed on the grating bars to fill up grooves between the grating bars, thereby completing the distributed feedback laser device.

In the structure of the distributed feedback laser device shown in FIG. 8, the light distribution control layer 12 of InGaAsP has the same composition as the InGaAsP layers 16 forming the grating bars of the diffraction grating 16. These layers 12 and 16 are continuously formed at the same opportunity in the same film forming apparatus. Therefore, the layers 12 and 16 exhibit the same dispersion trend in relation to the thickness and the composition. Therefore, the refractive indices of these layers 12 and 16 deviate from design values substantially in the same ratios. When the InGaAsP layers 16 defining the diffraction grating 16 are increased in thickness, for example, the beam coupling coefficient is increased in the conventional distributed feedback laser device. According to this embodiment, however, the InGaAsP layer 12 defining the light distribution control layer 12 is also increased in thickness in a trend and a ratio similar to those of the InGaAsP layers 16 defining the diffraction grating 16.

Figure 11:
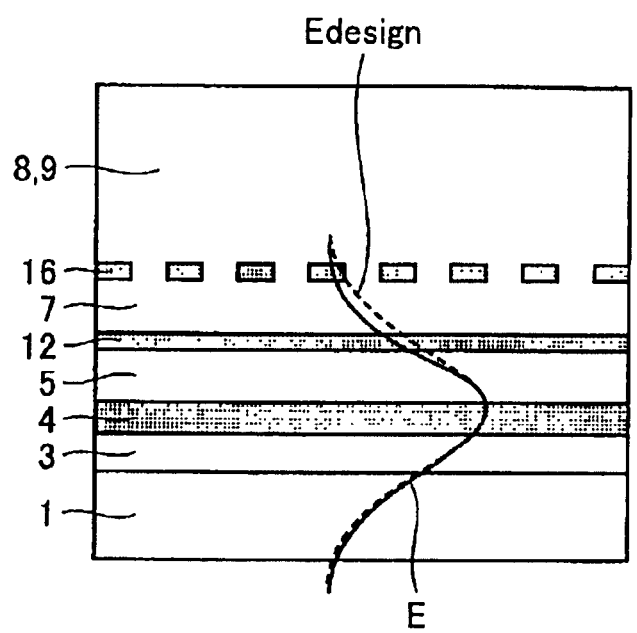
FIG. 11 illustrates that field strength distribution of light deviates to separate from the diffraction grating when the diffraction grating film is dispersed to be increased in thickness.

Light is attracted to a region having a high refractive index, as hereinabove described. As shown in FIG. 11, therefore, field strength distribution of light is separated from the diffraction grating 16 and attracted to the p-conductivity type InGaAsP layer 12. Such deviation of the field strength distribution reduces the beam coupling coefficient. Consequently, the beam coupling coefficient can be inhibited from deviation resulting from thickness variation of the InGaAsP layers 16.

Figure 12:
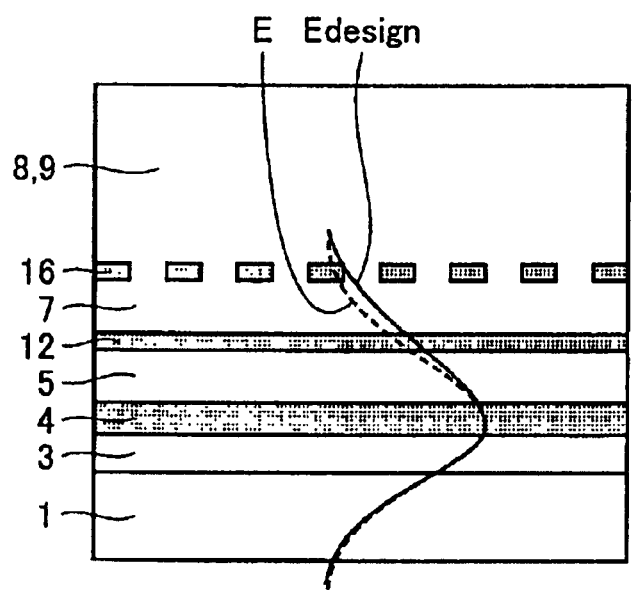
FIG. 12 illustrates that field strength distribution of light deviates to approach to the diffraction grating when the diffraction grating film is dispersed to be reduced in thickness.

When the InGaAsP layers 16 defining the diffraction grating 16 are reduced in thickness, the p-conductivity type InGaAsP layer 12 defining the light distribution control layer 12 is dispersed to be also reduced in thickness. Consequently, field strength distribution along the direction of the waveguide thickness is attracted to the diffraction grating 16, as shown in FIG. 12. Also in this case, the same mechanism as that shown in FIG. 4 acts as to thickness variation, to be capable of compensating for variation of the beam coupling coefficient.

While the above description has been made only with respect to thickness variation, the light distribution control layer 12 also compensates for refractive index variation resulting from composition variation of the InGaAsP layers 16 forming the grating bars of the diffraction grating 16 thereby compensating for variation of the beam coupling coefficient as a result.

As hereinabove described, the beam coupling coefficient can be inhibited from variation resulting from composition variation or thickness variation in the layers 16 defining the diffraction grating 16.

While the diffraction grating 16 is arranged on the active layer 4 according to the second embodiment, the diffraction grating 16 may alternatively be located under the active layer 4. The n- and p-conductivity types of the semiconductor layers may be inverted. The diffraction grating 16 may have one or a plurality of phase-shift parts. A cavity of the diffraction grating 16 may have phase shift corresponding to ¼ the in-medium wavelength and nonreflective coating at the center and on both ends respectively. The single vertical mode yield can be improved due to the phase shift and the nonreflective coating.

While the second embodiment has been described with reference to an InP/InGaAsP-based distributed feedback laser device, the present invention is also applicable to an InP/AlGaInAs-based distributed feedback laser device, for example. Further, the present invention is also applicable to a distributed feedback laser device in a device prepared by monolithically integrating a modulator and the distributed feedback laser device on a common substrate, for example.

(Third Embodiment)

Figure 13:
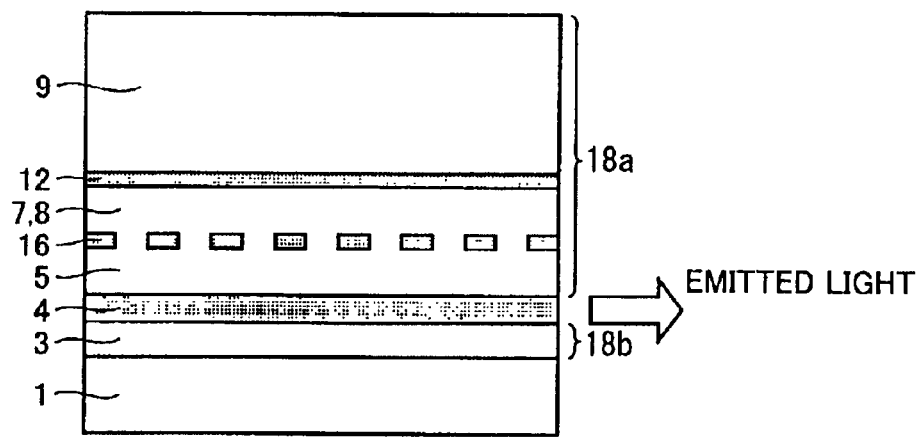
FIG. 13 illustrates a distributed feedback laser device according to a third embodiment of the present invention.

The feature of a distributed feedback laser device according to a third embodiment of the present invention resides in that a light distribution control layer 12 is provided on a position holding a diffraction grating 16 between the same and an active layer 4, as shown in FIG. 13. Referring to FIG. 13, an n-conductivity type InP layer 3 is located on an n-conductivity type InP substrate 1, and an InGaAsP layer 4 defining the active layer 4 is provided on the n-conductivity type InP layer 3. A p-conductivity type InP layer 5 is located on the active layer 4, and the diffraction grating 16 formed by p-conductivity type InGaAsP films 16 is located on the p-conductivity type InP layer 5. A p-conductivity type InP layer 7 is provided on the diffraction grating 16 to fill up etching grooves between grating bars of the diffraction grating 16, and a p-conductivity type InGaAsP layer 12 defining the light distribution control layer 12 is located on the p-conductivity type InP layer 7. A p-conductivity type InP layer 9 is provided on the p-conductivity type InGaAsP layer 12. The light distribution control layer 12 is arranged in a cladding layer 18a.

Figure 14:
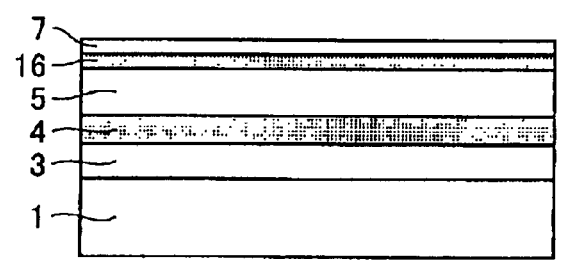
FIG. 14 illustrates a state forming a cladding film on a diffraction grating film in a method of fabricating the distributed feedback laser device shown in FIG. 13.

A method of fabricating the aforementioned distributed feedback laser device is now described. As shown in FIG. 14, (1) the n-conductivity type InP layer 3, (2) the active layer 4 of InGaAsP, (3) the p-conductivity type InP layer 5, (4) the p-conductivity type InGaAsP films 16 defining the diffraction grating 16 and (5) the p-conductivity type InP layer 7 are successively formed on the n-conductivity type InP substrate 1 in ascending order.

Figure 15:
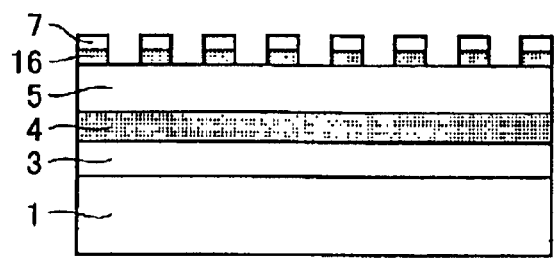
FIG. 15 illustrates a state forming a diffraction grating by patterning the diffraction grating film and the cladding film.

Thereafter the p-conductivity type InGaAsP films 16 and the p-conductivity type InP layer 7 are patterned by interference exposure, electron beam exposure and etching for forming the grating bars of the diffraction grating 16, as shown in FIG. 15. The p-conductivity type InP layer 8 is formed on the grating bars to fill up the etching grooves of the diffraction grating 16 followed by formation of the p-conductivity type InP layer 9, thereby completing the distributed feedback laser device shown in FIG. 13.

It is important that at least the p-conductivity type InP layer 5 held between the active layer 4 and the diffraction grating 16 and the p-conductivity type InP layers 7 and 8 held between the diffraction grating 16 and the light distribution control layer 12 must be formed in film forming apparatuses having the same dispersion trend. The film forming apparatuses having the same dispersion trend can be selected from (a1) the same film forming apparatus, (a2) film forming apparatuses similar in inplane distribution of thicknesses to each other and (a3) film forming apparatuses of the same structure. Thus, the p-conductivity type InP layers 5, 7 and 8 can be substantially equalized with each other in in-plane distribution of deviation from design values of thicknesses.

MOCVD (metal organic chemical vapor deposition), MBE (molecular beam epitaxy) or LPE (liquid phase epitaxy) can be employed for the aforementioned film formation.

Figure 16:
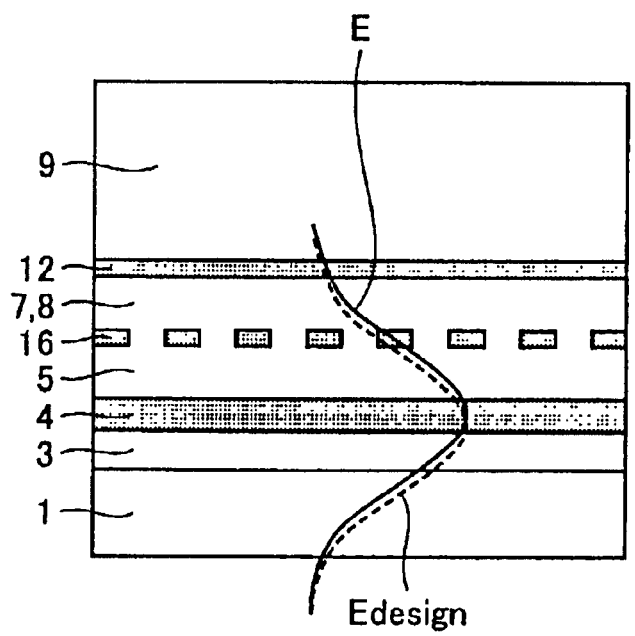
FIG. 16 illustrates that field strength distribution of light deviates to approach to the diffraction grating when a lower cladding layer located under the diffraction grating film is dispersed to be increased in thickness.

When the p-conductivity type InP layer 5 is increased in thickness, for example, the distance between the active layer 4 and the diffraction grating 16 is increased and hence the beam coupling coefficient is reduced in the conventional device. According to the third embodiment, however, the p-conductivity type InP layers 7 and 8 are also increased in thickness in the same ratio as the p-conductivity type InP layer 5. Therefore, field strength distribution E along the waveguide thickness direction deviates from a design value $E_{design}$ and is attracted to the diffraction grating 16 due to the effect of the increased thicknesses of the p-conductivity type InP layers 7 and 8, as shown in FIG. 16. This attraction of the field strength distribution E toward the diffraction grating 16 increases the beam coupling coefficient, thereby compensating for reduction of the beam coupling coefficient resulting from the increased thickness of the p-conductivity type InP layer 5.

Figure 17:
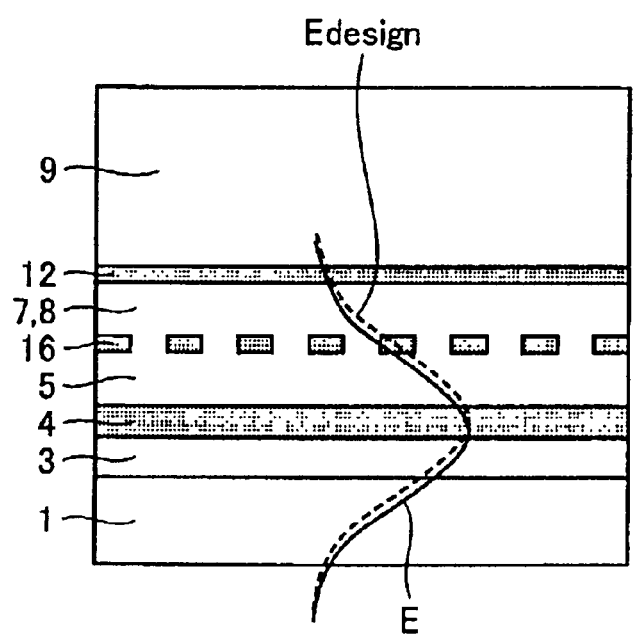
FIG. 17 illustrates that field strength distribution of light deviates to separate from the diffraction grating when the lower cladding layer located under the diffraction grating film is dispersed to be reduced in thickness.

When the p-conductivity type InP layer 5 is reduced in thickness, the distance between the active layer 4 and the diffraction grating 16 is reduced and hence the beam coupling coefficient is increased in the conventional device. According to this embodiment, however, the p-conductivity type InP layers 7 and 8 are also reduced in thickness in the same trend as the p-conductivity type InP layer 5. Therefore, the field strength distribution E along the waveguide thickness direction deviates from the design value $E_{design}$ and is moved toward the active layer 4 to separate from the diffraction grating 16, as shown in FIG. 17. Also in this case, therefore, it is possible to compensate for variation of the beam coupling coefficient.

Figure 18:
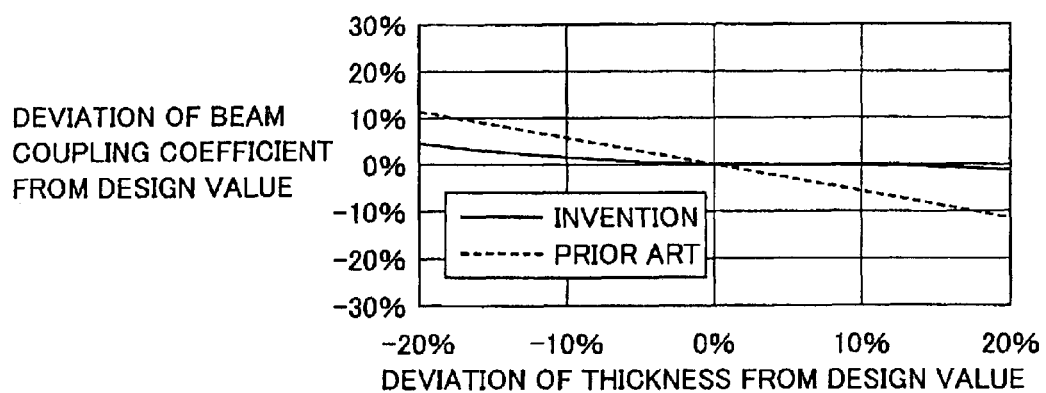
FIG. 18 illustrates deviation of beam coupling coefficients from design values upon thickness variation of an upper cladding layer in the distributed feedback laser device shown in FIG. 13.

FIG. 18 illustrates deviation of beam coupling coefficients from design values upon thickness variation of the InP layers 5, 7 and 8 in the distributed feedback laser device according to this embodiment. According to FIG. 18, variation of the beam coupling coefficient is suppressed in the inventive distributed feedback laser device to about ⅙ as compared with the prior art. Consequently, the distributed feedback laser device can be inhibited from characteristic dispersion.

While the diffraction grating 16 is arranged on the active layer 4 according to the third embodiment, the diffraction grating 16 may alternatively be located under the active layer 4. The n- and p-conductivity types of the semiconductor layers may be inverted. The diffraction grating 16 may have one or a plurality of phase-shift parts. A cavity of the diffraction grating 16 may have phase shift corresponding to ¼ the in-medium wavelength and nonreflective coating at the center and on both ends respectively. The single vertical mode yield can be improved due to the phase shift and the nonreflective coating.

The present invention is also applicable to an InP/AlGaInAs-based distributed feedback laser device, for example. Further, the present invention is also applicable to a distributed feedback laser device in a device prepared by monolithically integrating a modulator and the distributed feedback laser device on a common substrate, for example.

(Fourth Embodiment)

A distributed feedback laser device according to a fourth embodiment of the present invention is provided with two light distribution control layers 2 and 12, as shown in FIG.

Figure 19:
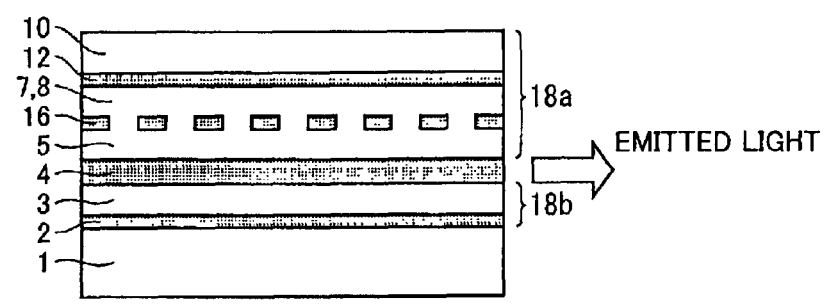
FIG. 19 illustrates a distributed feedback laser device according to a fourth embodiment of the present invention.

19. Referring to FIG. 19, the distributed feedback laser device according to the fourth embodiment comprises the light distribution control layers 2 and 12 identical to those in the distributed feedback laser devices according to the first and third embodiments respectively. The light distribution control layer 2 is arranged in a cladding layer 18b of InP, more specifically arranged between the cladding layer 18b and an InP substrate 1, while the light distribution control layer 12 is arranged in a cladding layer 18a.

Referring to FIG. 19, an n-conductivity type InGaAsP layer 2 defining the first light distribution control layer 2 is located on the n-conductivity type InP substrate 1, and an n-conductivity type InP layer 3 is provided on the n-conductivity type InGaAsP layer 2. An InGaAsP layer 4 defining an active layer 4 is located on the n-conductivity type InP layer 3, and a p-conductivity type InP layer 5 is provided on the active layer 4. A diffraction grating 16 formed by n-conductivity type InGaAsP layers 16 having the same band gap as the n-conductivity type InGaAsP layer 2 is located on the p-conductivity type InP layer 5, and p-conductivity type InP layers 7 and 8 are provided on the diffraction grating 16 to fill up grooves between grating bars of the diffraction grating 16. A p-conductivity type InGaAsP layer 12 defining the second light distribution control layer 12 is located on the p-conductivity type InP layers 7 and 8, and a p-conductivity type InP layer 10 is provided on the p-conductivity type InGaAsP layer 12.

Figure 20:
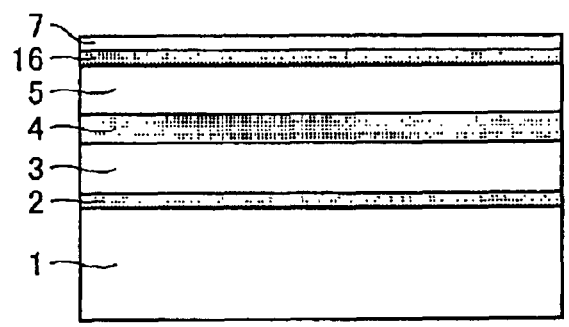
FIG. 20 illustrates a state forming a cladding film on a diffraction grating film in a method of fabricating the distributed feedback laser device shown in FIG. 19.

A method of fabricating the distributed feedback laser device shown in FIG. 19 is now described. As shown in FIG. 20, (1) the n-conductivity type InGaAsP layer 2, (2) the n-conductivity type InP layer 3, (3) the active layer 4 of InGaAsP, (4) the p-conductivity type InP layer 5, (5) the p-conductivity type InGaAsP films 16 having the same band gap as the n-conductivity type InGaAsP layer 2 and (6) the p-conductivity type InP layer 7 are successively formed on the n-conductivity type InP substrate 1 in ascending order in the same film forming processing. MOCVD, MBE or LPE can be employed for this film formation.

Figure 21:
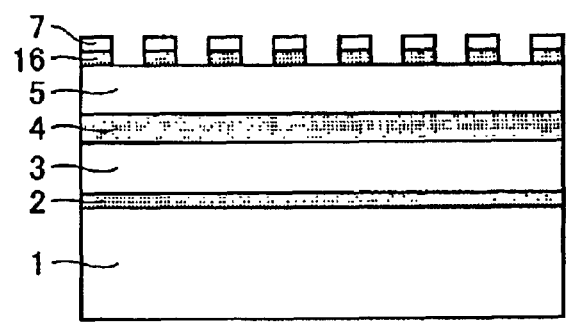
FIG. 21 illustrates a state forming a diffraction grating by patterning the diffraction grating film and the cladding film.

Thereafter the p-conductivity type InGaAsP layers 16 and the p-conductivity type InP layer 7 are partially removed at a prescribed pitch by interference exposure, electron beam exposure and etching for distributing grating bars at the prescribed pitch, thereby forming the diffraction grating 16 as shown in FIG. 21. Thereafter (7) the p-conductivity type InP layer 8 is formed to fill up grooves between the grating bars of the diffraction grating 16, followed by formation of (7) the p-conductivity type InGaAsP layer 12 and (8) the p-conductivity type InP layer 10.

In the aforementioned film formation, first film formation before etching for forming the diffraction grating 16 and second film formation after the etching are carried out in (a1) the same film forming apparatus, (a2) film forming apparatuses similar in in-plane distribution of thicknesses to each other or (a3) film forming apparatuses of the same structure.

Both of the n-conductivity type InGaAsP layer 2 defining the first light distribution control layer 2 and the n-conductivity type InGaAsP films 16 defining the diffraction grating 16 are formed before the aforementioned etching. Therefore, these n-conductivity type InGaAsP layers 2 and 16, having the same composition, are formed by continuous processing. Therefore, these n-conductivity type InGaAsP layers 2 and 16 deviate from design values of thicknesses, compositions or refractive indices substantially in the same ratio.

Figure 22:
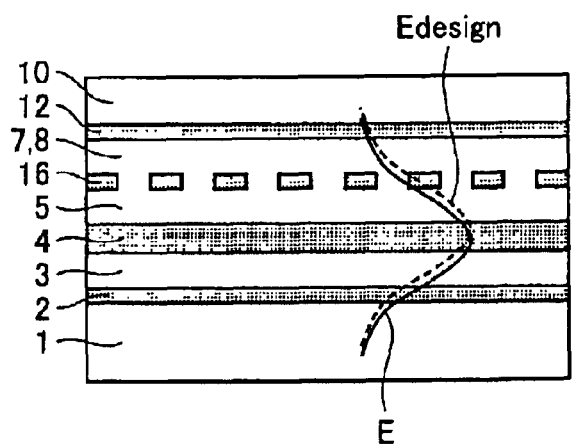
FIG. 22 illustrates that field strength distribution of light deviates to separate from the diffraction grating when the diffraction grating film is dispersed to be increased in thickness.

When the n-conductivity type InGaAsP layers 16 are increased in thickness, the beam coupling coefficient is increased in the conventional distributed feedback laser device. According to this embodiment, however, the n-conductivity type InGaAsP layer 2 is also increased in thickness in the same ratio, and hence field strength distribution E along the waveguide thickness direction is attracted to the n-conductivity type InGaAsP layer 2 beyond a design value $E_{design}$ to separate from the diffraction grating 16, as shown in FIG. 22. Such deviation of the field strength distribution E acts to reduce the beam coupling coefficient, and hence the beam coupling coefficient can be inhibited from variation resulting from thickness variation of the n-conductivity type InGaAsP layers 2 and 16 by properly selecting the thicknesses of these layers 2 and 16.

Figure 23:
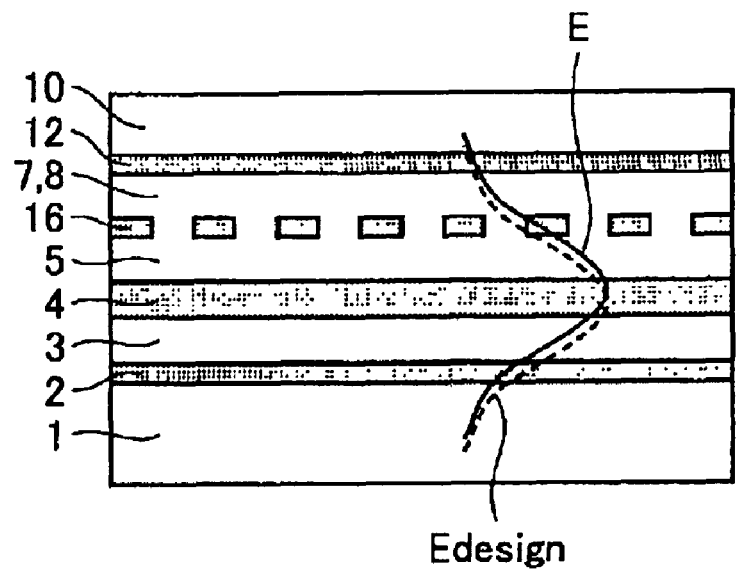
FIG. 23 illustrates that field strength distribution of light deviates to approach to the diffraction grating when the diffraction grating is dispersed to be reduced in thickness.

When the n-conductivity type InGaAsP layers 16 are reduced in thickness, the beam coupling coefficient is reduced. At this time, the n-conductivity type InGaAsP layer 2 is also reduced in thickness on the basis of the aforementioned reason. Therefore, the field strength distribution E along the wavelength thickness direction is attracted to the diffraction grating 16, as shown in FIG. 23. The beam coupling coefficient is increased due to such movement of the field strength distribution E. Also in this case, therefore, the beam coupling coefficient can be inhibited from variation resulting from thickness variation of the n-conductivity type InGaAsP layers 2 and 16 by properly selecting the thicknesses of these layers 2 and 16.

The p-conductivity type InP layers 5, 7 and 8 holding the diffraction grating 16 therebetween are formed in any of the apparatuses (a1), (a2) and (a3) as hereinabove described, to exhibit similar in-plane thickness distribution. Therefore, these layers 5, 7 and 8 deviate from design values with substantially identical in-plane distribution.

Figure 24:
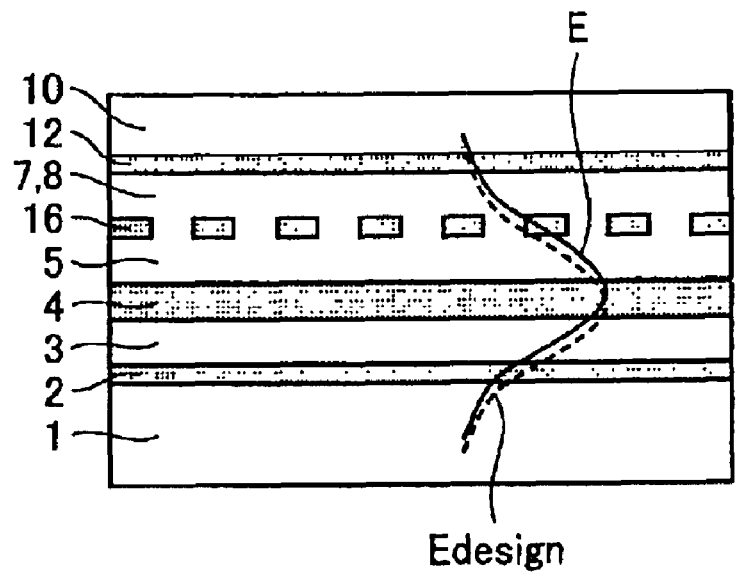
FIG. 24 illustrates that field strength distribution of light deviates to approach to the diffraction grating when a lower cladding layer located under the diffraction grating film is dispersed to be increased in thickness.

When the p-conductivity type InP layer 5 is increased in thickness beyond the design value, therefore, the beam coupling coefficient is reduced in the prior art. According to this embodiment, however, the p-conductivity type InP layers 7 and 8 are also increased in thickness in the same ratio, and hence the field strength distribution E along the waveguide thickness direction is attracted to the diffraction grating 16 beyond the design value $E_{design}$, as shown in FIG. 24. This deviation of the field strength distribution E acts to increase the beam coupling coefficient, whereby variation of the beam coupling coefficient resulting from variation of the p-conductivity type InP layer 5 and variation resulting from that of the p-conductivity type InP layers 7 and 8 cancel with each other. Consequently, the beam coupling coefficient is inhibited from variation resulting from dispersion of thicknesses in fabrication.

Figure 25:
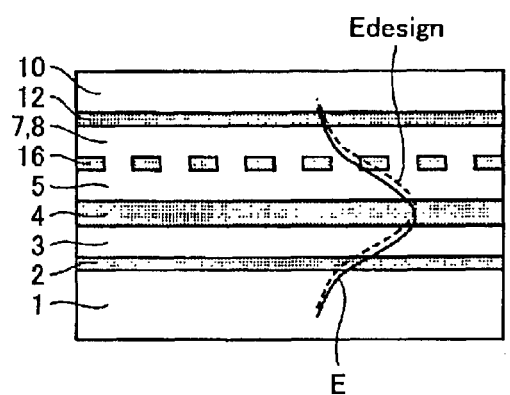
FIG. 25 illustrates that field strength distribution of light deviates to separate from the diffraction grating when the lower cladding layer located under the diffraction grating film is dispersed to be reduced in thickness.

When the p-conductivity type InP layer 5 is reduced in thickness beyond the design value, the beam coupling coefficient is increased in the prior art. According to this embodiment, however, the p-conductivity type InP layers 7 and 8 are also reduced in thickness in the same ratio, and hence the field strength distribution E along the waveguide thickness direction is separated from the diffraction grating 16 beyond the design value $E_{design}$, as shown in FIG. 25. This deviation of the field strength distribution E acts to increase the beam coupling coefficient, whereby variation of the beam coupling coefficient resulting from variation of the p-conductivity type InP layer 5 and variation resulting from that of the p-conductivity type InP layers 7 and 8 cancel with each other. Consequently, the beam coupling coefficient is inhibited from remarkable variation resulting from dispersion of thicknesses in fabrication.

According to the structure of the distributed feedback laser device according to this embodiment, as hereinabove described, the beam coupling coefficient can be inhibited from variation resulting from composition variation or thickness variation of the layers 16 defining the diffraction grating 16. Further, thickness variation of the p-conductivity type InP layers 5, 7 and 8 holding the diffraction grating 16 therebetween influences the beam coupling coefficient in opposite directions, thereby inhibiting the beam coupling coefficient from variation resulting from the thickness variation of the p-conductivity type InP layers 5, 7 and 8.

Figure 26:
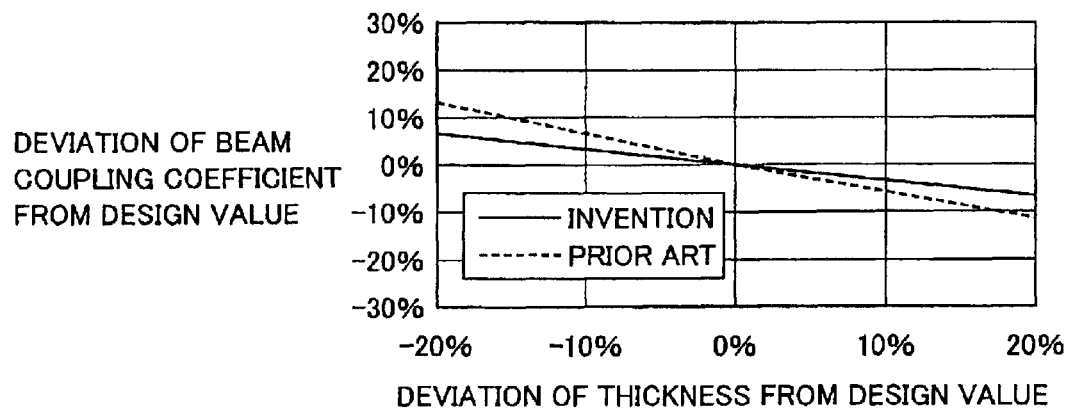
FIG. 26 illustrates deviation of beam coupling coefficients from design values upon thickness variation of the lower cladding layer in the distributed feedback laser device shown in FIG. 19.
Figure 27:
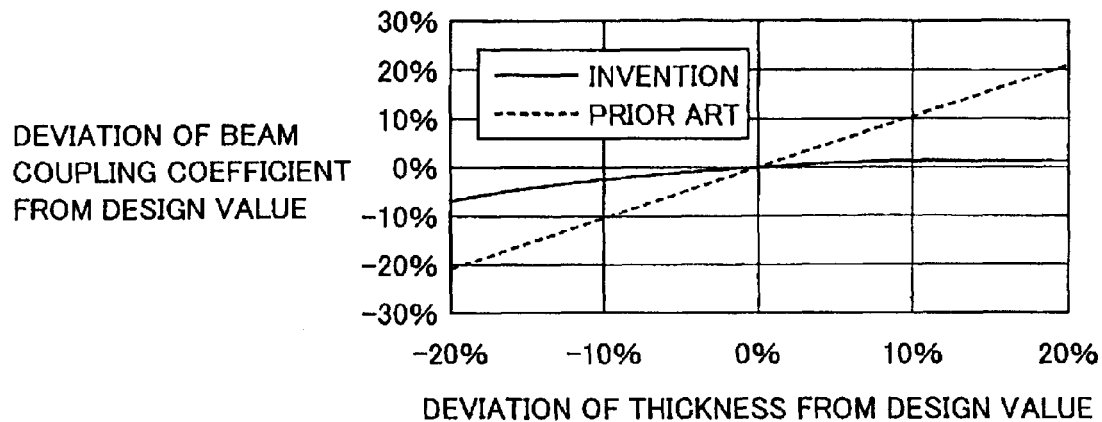
FIG. 27 illustrates deviation of beam coupling coefficients from design values upon thickness variation of the diffraction grating in the distributed feedback laser device shown in FIG. 19.
Figure 28:
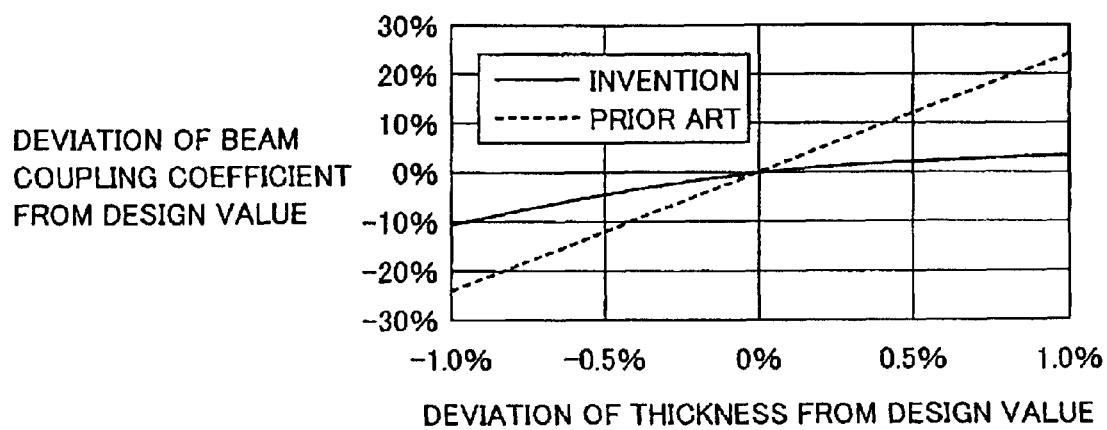
FIG. 28 illustrates deviation of beam coupling coefficients from design values upon refractive index variation of the diffraction grating in the distributed feedback laser device shown in FIG. 19.

FIGS. 26 to 28 illustrate results of quantitative calculation of suppression of variation of beam coupling coefficients according to this embodiment. FIG. 26 illustrates deviation of the beam coupling coefficients from design values upon thickness variation of the p-conductivity type InP layers 5, 7 and 8. According to FIG. 26, the beam coupling coefficient is substantially halved in this embodiment as compared with the prior art. FIG. 27 illustrates deviation of the beam coupling coefficients from design values upon thickness variation of the diffraction grating 16. According to FIG. 27, the beam coupling coefficient is reduced below ½ in this embodiment as compared with the prior art. FIG. 28 illustrates deviation of the beam coupling coefficients from design values upon refractive index variation of the diffraction grating 16. According to FIG. 28, the beam coupling coefficient is remarkably reduced below ½ in this embodiment as compared with the prior art.

Also in the distributed feedback laser device according to this embodiment, the diffraction grating 16 may alternatively be arranged under the active layer 4, similarly to the first to third embodiments. The n- and p-conductivity types of the semiconductor layers may be inverted. The diffraction grating 16 of the distributed feedback laser device may have phase shift. The distributed feedback laser device may be made of another material such as InP/AlGaInAs, for example. Further, the distributed feedback laser device may be integrated with a modulator.

(Fifth Embodiment)

Figure 29:
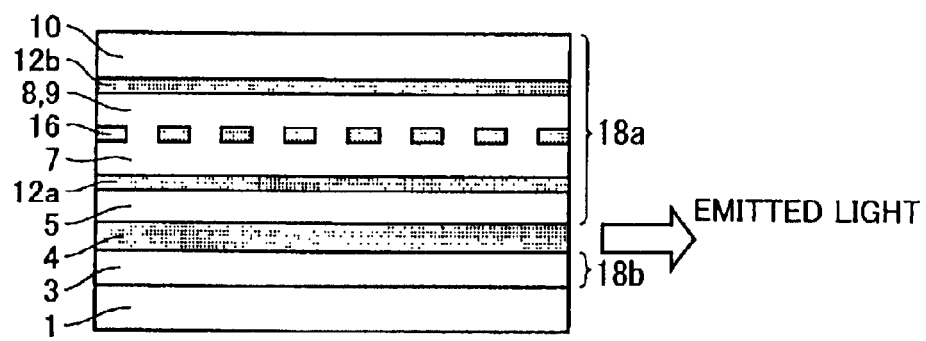
FIG. 29 illustrates a distributed feedback laser device according to a fifth embodiment of the present invention.

A distributed feedback laser device according to a fifth embodiment of the present invention is provided with two light distribution control layers 12a and 12b similarly to the fourth embodiment, as shown in FIG. 29. Referring to FIG. 29, the distributed feedback laser device according to the fifth embodiment comprises the light distribution control layers 12a and 12b identical to those in the distributed feedback laser devices according to the second and third embodiments respectively. Both of these light distribution control layers 12a and 12b are arranged in a cladding layer 18a.

Referring to FIG. 29, an n-conductivity type InP layer 3 is located on an n-conductivity type InP substrate 1, and an InGaAsP layer 4 defining an active layer 4 is located on the n-conductivity type InP layer 3. A p-conductivity type InP layer 5 is provided on the active layer 4, a p-conductivity type InGaAsP layer 12a defining the first light distribution control layer 12a is located on the p-conductivity type InP layer 5, and a p-conductivity type InP layer 7 is provided on the p-conductivity type InGaAsP layer 12a. A diffraction grating 16 is located on the p-conductivity type InP layer 7 followed by location of p-conductivity type InP layers 8 and 9 as well as a p-conductivity type InGaAsP layer 12b defining the second light distribution control layer 12b, and a p-conductivity type InP layer 10 is provided on the p-conductivity type InGaAsP layer 12b.

Figure 30:
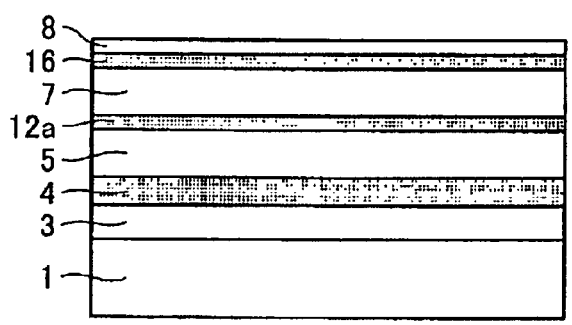
FIG. 30 illustrates a state forming a cladding film on a diffraction grating film in a method of fabricating the distributed feedback laser device shown in FIG. 29.

A method of fabricating the distributed feedback laser device shown in FIG. 29 is now described. As shown in FIG. 30, (1) the n-conductivity type InP layer 3, (2) the active layer 4 of InGaAsP, (3) the p-conductivity type InP layer 5, (4) the p-conductivity type InGaAsP layer 12a, (5) the p-conductivity type InP layer 7, (6) a p-conductivity type InGaAsP film 16 and (7) the p-conductivity type InP layer 8 are successively formed on the n-conductivity type InP substrate 1 in ascending order in the same film forming processing. MOCVD, MBE or LPE can be employed for this film formation.

Figure 31:
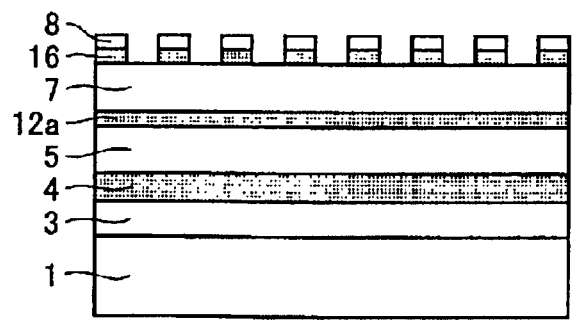
FIG. 31 illustrates a state forming a diffraction grating by patterning the diffraction grating film and the cladding film.

Thereafter the p-conductivity type InGaAsP film 16 and the p-conductivity type InP layer 8 are patterned by interference exposure, electron beam exposure and etching for forming grating bars, as shown in FIG. 31. Thereafter (8) the p-conductivity type InP layer 9 is formed to fill up grooves between the grating bars of the diffraction grating 16, followed by formation of (9) the p-conductivity type InGaAsP layer 12b and (10) the p-conductivity type InP layer 10.

In the aforementioned film formation, first film formation before etching for forming the diffraction grating 16 and second film formation after the etching are carried out in (a1) the same film forming apparatus, (a2) film forming apparatuses similar in in-plane distribution of thicknesses to each other or (a3) film forming apparatuses of the same structure.

Both of the n-conductivity type InGaAsP layer 12a defining the first light distribution control layer 12a and the n-conductivity type InGaAsP film 16 defining the diffraction grating 16 are formed before the aforementioned etching. Therefore, these n-conductivity type InGaAsP layers 12a and 16 are formed by continuous processing. Therefore, these n-conductivity type InGaAsP layers 12a and 16 deviate from design values of thicknesses, compositions or refractive indices substantially in the same ratio.

Figure 32:
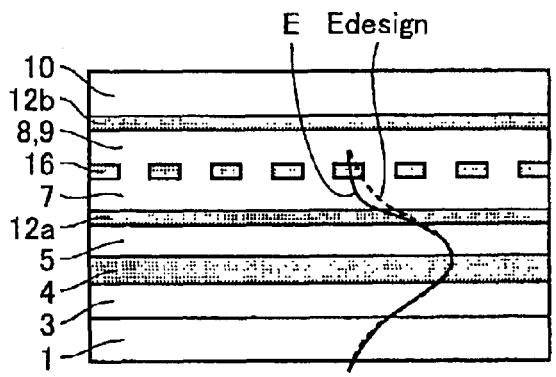
FIG. 32 illustrates that field strength distribution of light deviates to separate from the diffraction grating when the diffraction grating is dispersed to be increased in thickness.

When the n-conductivity type InGaAsP film 16 is increased in thickness, the beam coupling coefficient is increased in the conventional distributed feedback laser device. According to this embodiment, however, the n-conductivity type InGaAsP layer 12a is also increased in thickness in the same ratio, and hence field strength distribution E along the waveguide thickness direction is attracted to the n-conductivity type InGaAsP layer 12a beyond a design value $E_{design}$ to separate from the diffraction grating 16, as shown in FIG. 32. Such deviation of the field strength distribution E acts to reduce the beam coupling coefficient, and hence the beam coupling coefficient can be inhibited from variation resulting from thickness variation of the n-conductivity type InGaAsP layers 12a and 16 by properly selecting the thicknesses of these layers 12a and 16.

Figure 33:
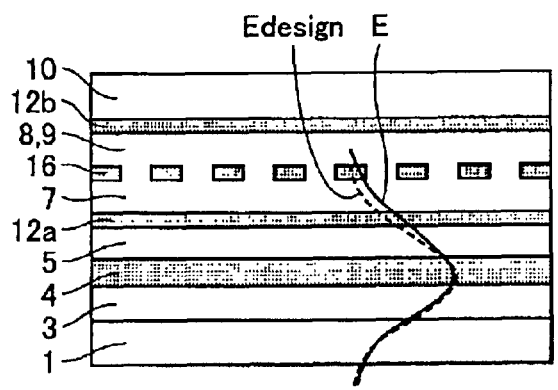
FIG. 33 illustrates that field strength distribution of light deviates to approach to the diffraction grating when the diffraction grating is dispersed to be reduced in thickness.

When the n-conductivity type InGaAsP film 16 is reduced in thickness, the beam coupling coefficient is reduced. At this time, the n-conductivity type InGaAsP layer 12a is also reduced in thickness on the basis of the aforementioned reason. Therefore, the field strength distribution E along the wavelength thickness direction is attracted to the diffraction grating 16, as shown in FIG. 33. The beam coupling coefficient is increased due to such attraction of the field strength distribution E. Also in this case, therefore, the beam coupling coefficient can be inhibited from variation resulting from thickness variation of the n-conductivity type InGaAsP layers 12a and 16 by properly selecting the thicknesses of these layers 12a and 16.

The p-conductivity type InP layers 7, 8 and 9 holding the diffraction grating 16 therebetween are formed in any of the film forming apparatuses (a1), (a2) and (a3) as hereinabove described, to exhibit similar in-plane thickness distribution. Therefore, these layers 7, 8 and 9 deviate from design values with substantially identical in-plane distribution.

Figure 34:
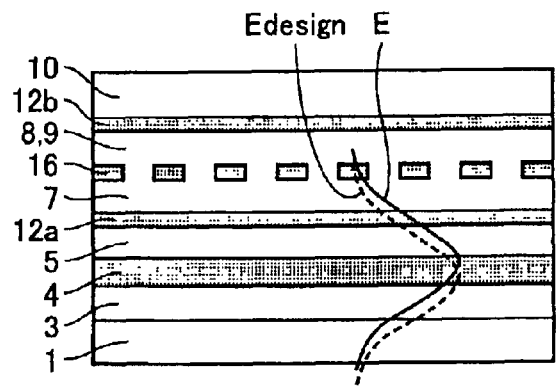
FIG. 34 illustrates that field strength distribution of light deviates to approach to the diffraction grating when a lower cladding layer located under the diffraction grating film is dispersed to be increased in thickness.

When the p-conductivity type InP layer 7 is increased in thickness beyond the design value, therefore, the beam coupling coefficient is reduced in the prior art. According to this embodiment, however, the p-conductivity type InP layers 8 and 9 are also increased in thickness in the same ratio, and hence the field strength distribution E along the waveguide thickness direction is attracted to the diffraction grating 16 beyond the design value $E_{design}$, as shown in FIG. 34. This deviation of the field strength distribution E acts to increase the beam coupling coefficient, whereby variation of the beam coupling coefficient resulting from variation of the p-conductivity type InP layer 7 and variation resulting from that of the p-conductivity type InP layers 8 and 9 cancel with each other. Consequently, the beam coupling coefficient is inhibited from remarkable variation resulting from dispersion of thicknesses in fabrication.

Figure 35:
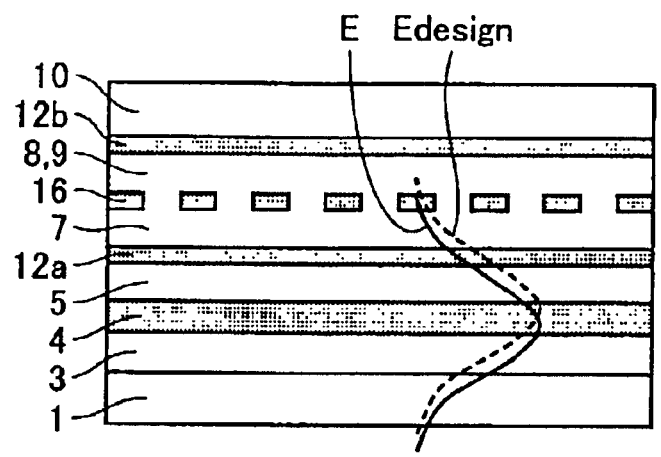
FIG. 35 illustrates that field strength distribution of light deviates to separate from the diffraction grating when the lower cladding layer located under the diffraction grating is dispersed to be reduced in thickness.

When the p-conductivity type InP layer 7 is reduced in thickness beyond the design value, the beam coupling coefficient is increased in the prior art. According to this embodiment, however, the p-conductivity type InP layers 8 and 9 are also reduced in thickness in the same ratio, and hence the field strength distribution E along the waveguide thickness direction is separated from the diffraction grating 16 beyond the design value $E_{design}$, as shown in FIG. 35. This deviation of the field strength distribution E acts to increase the beam coupling coefficient, whereby variation of the beam coupling coefficient resulting from variation of the p-conductivity type InP layer 7 and variation resulting from that of the p-conductivity type InP layers 8 and 9 cancel with each other. Consequently, the beam coupling coefficient is inhibited from remarkable variation resulting from dispersion of thicknesses in fabrication.

According to the structure of the distributed feedback laser device according to this embodiment, as hereinabove described, the beam coupling coefficient can be inhibited from variation resulting from composition variation or thickness variation of the layer 16 defining the diffraction grating 16. Further, thickness variation of the p-conductivity type InP layers 7, 8 and 9 holding the diffraction grating 16 therebetween influences the beam coupling coefficient in opposite directions, thereby inhibiting the beam coupling coefficient from variation resulting from the thickness variation of the p-conductivity type InP layers 7, 8 and 9.

Also in the distributed feedback laser device according to this embodiment, the diffraction grating 16 may alternatively be arranged under the active layer 4 similarly to the first to fourth embodiments, or the diffraction grating 16 of the distributed feedback laser device may have phase shift. The distributed feedback laser device may be made of another material such as InP/AlGaInAs, for example. Further, the distributed feedback laser device may be integrated with a modulator.

(Sixth Embodiment)

Figure 36:
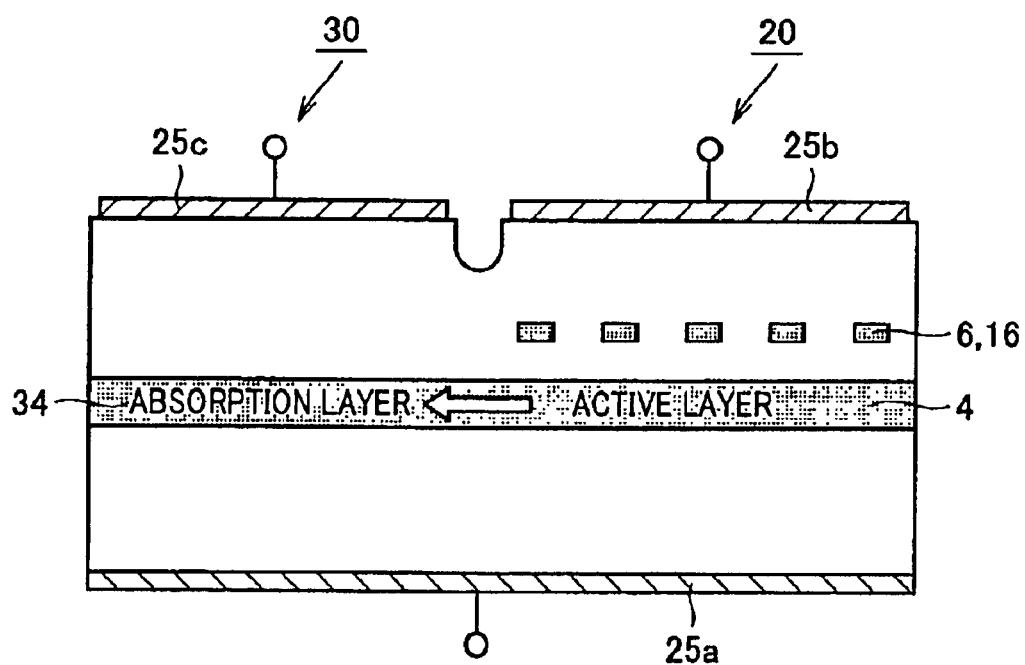
FIG. 36 illustrates a semiconductor optical device according to a sixth embodiment of the present invention.
Figure 39:
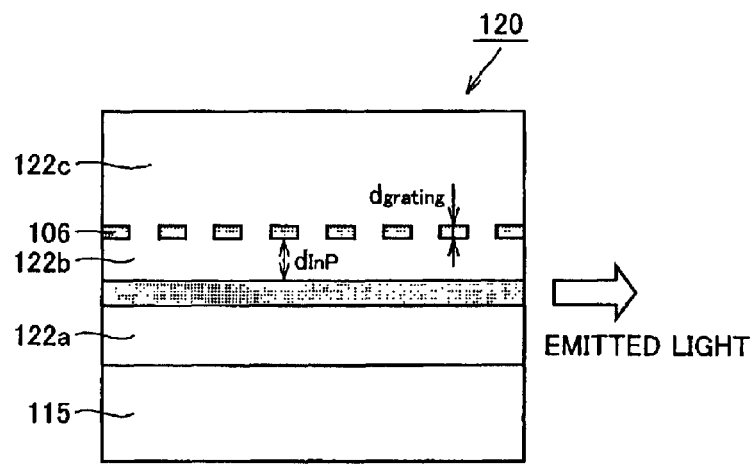
FIG. 39 illustrates another conventional distributed feedback laser device.
Figure 40:
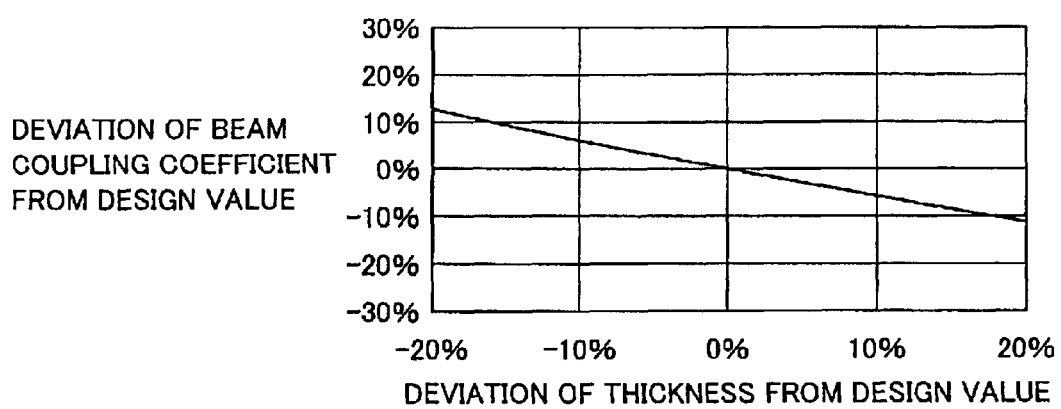
FIG. 40 illustrates deviation of a beam coupling coefficient from a design value upon thickness variation of a cladding layer deciding the distance between an active layer and a diffraction grating in the distributed feedback laser device shown in FIG. 39.
Figure 41:
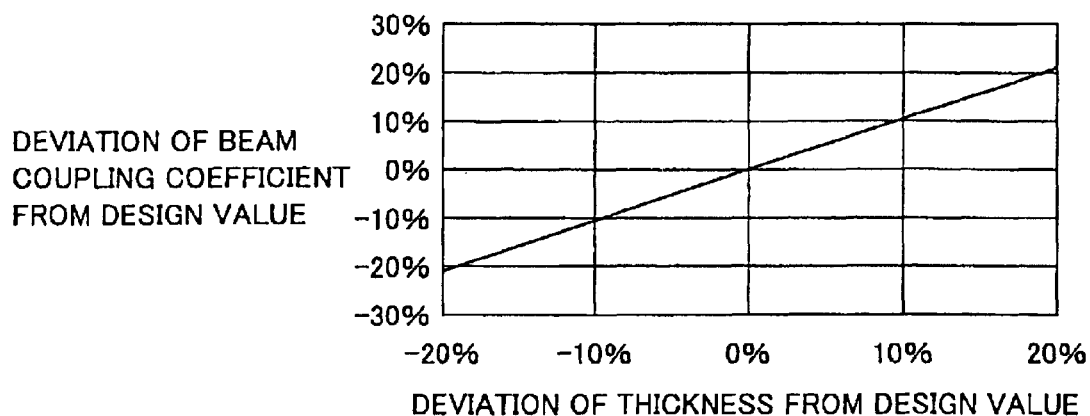
FIG. 41 illustrates deviation of the beam coupling coefficient from the design value upon thickness variation of the diffraction grating in the distributed feedback laser device shown in FIG. 39.
Figure 42:
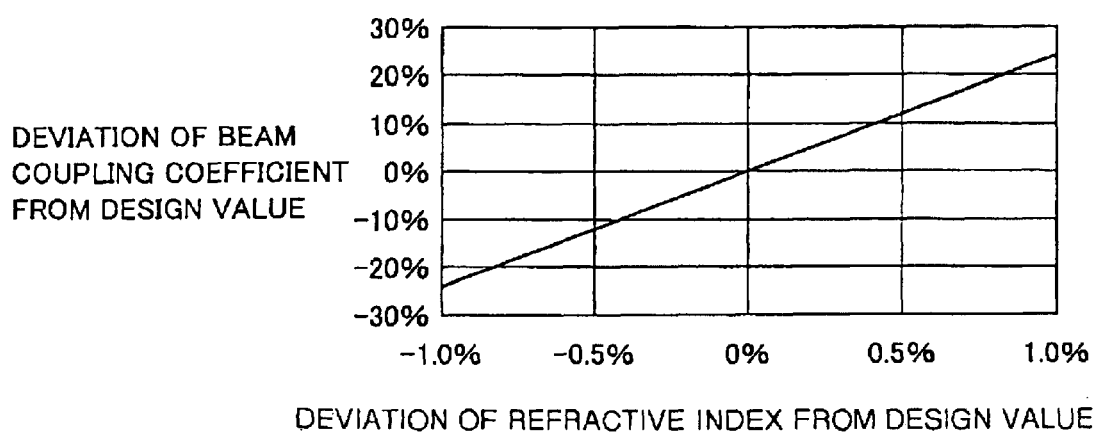
FIG. 42 illustrates deviation of the beam coupling coefficient from the design value upon refractive index variation of the diffraction grating in the distributed feedback laser device shown in FIG. 39.

Referring to FIG. 36, a distributed feedback laser device 20 and a modulator 30 are integrally monolithically formed on a semiconductor substrate (not shown) in a semiconductor optical device according to a sixth embodiment of the present invention. The distributed feedback laser device 20 is formed by any of those described above with reference to the first to fifth embodiments.

The monolithically integrated device applies a voltage across electrodes 25a and 25b and injects a current into an active layer 4 for making oscillation along the active layer 4 while selecting a specific wavelength through a diffraction grating 6 or 16 or the like for continuing oscillation at the specific wavelength. Oscillated light is guided to an absorption layer 34 of the modulator 30 from the active layer 4, and can be modulated by the voltage applied across the electrodes 25a and 25b of the modulator 30.

The distributed feedback laser device 20 is formed by any of those described with reference to the first to fifth embodiments, and hence the beam coupling coefficient is remarkably inhibited from variation resulting from dispersion in fabrication. Further, the distributed feedback laser device 20 and the modulator 30 are monolithically integrated with each other, whereby the semiconductor optical device is miniaturized. The distributed feedback laser device 20 and the modulator 30 can be integrated in a series of processing steps, whereby fabrication efficiency can be improved.

In any of First to Sixth Embodiment, the refractive index of the light distribution control layer may be rendered higher than the refractive index of the cladding layers.

According to this structure, the light distribution control layer can effectively attract field strength distribution of light.

In any of First to Sixth Embodiment, the method of fabricating a distributed feedback laser device may form a lower cladding layer on a position corresponding to an underlayer for the diffraction grating, form a diffraction grating film defining the diffraction grating on the lower cladding layer, etch the diffraction grating film for forming the diffraction grating including grating bars and form an upper cladding layer on the diffraction grating to fill up a portion subjected to the etching in formation of the diffraction grating and the cladding layers including the diffraction grating, by forming the lower cladding layer and the upper cladding layer in any of (a1) the same film forming apparatus, (a2) film forming apparatuses similar in in-plane distribution of thicknesses to each other and (a3) film forming apparatuses of the same structure.

According to this structure, upper and lower cladding layers holding the diffraction grating from above and from below respectively can be formed to have the same dispersion trend. In addition to suppression of variation of the beam coupling coefficient based on the same dispersion trend of the diffraction grating film and the light distribution control layer, therefore, variation factors, resulting from dispersion in fabrication of the cladding layers, influencing the beam coupling coefficient can be canceled. Consequently, the beam coupling coefficient can be inhibited from variation resulting from dispersion in fabrication, and the yield can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A distributed feed back laser device comprising:
   a semiconductor substrate; and
   a plurality of semiconductor layers supported by said semiconductor substrate and including:
      an active layer;
      first and second cladding layers having a refractive index and located on opposite sides of said active layer;
      a diffraction grating having grating bars with a refractive index higher than the refractive index of said first and second cladding layers, the grating bars being disposed within one of said first and second cladding layers, and extending in a direction perpendicular to a light emission direction, at a pitch in the light emission direction; and
      at least one light distribution control layer, located in one of said first and second cladding layers, spaced from said grating bars, and having the same composition and the same refractive index as said grating bars.

2. The distributed feedback laser device according to claim 1, wherein said active layer is between said light distribution control layer and said diffraction grating.

3. The distributed feedback laser device according to claim 1, wherein said light distribution control layer is located between said diffraction grating and said active layer.

4. The distributed feedback laser device according to claim 1, wherein said diffraction grating is between said light distribution control layer and said active layer.

5. The distributed feedback laser device according to claim 1, wherein said light distribution control layer consists of
   a first light distribution control layer, wherein said active layer is located between said first light distribution control layer and said diffraction grating, and
   a second light distribution control layer, wherein said diffraction grating is located between said second light distribution control layer and said active layer.

6. The distributed feedback laser device according to claim 1, wherein said light distribution control layer consists of
a first light distribution control layer located between said diffraction grating and said active layer, and
a second light distribution control layer, wherein said diffraction grating is located between said second light distribution control layer and said active layer.

7. The distributed feedback laser device according to claim 1, wherein said light distribution control layer has a refractive index higher than the refractive index of said cladding layers.

8. The distributed feedback laser device according to claim 1, wherein said diffraction grating has a phase shift part.

9. The distributed feedback laser device according to claim 8, wherein said phase shift part of said diffraction grating is located at the center of a cavity for shifting phase of light corresponding to ¼ of a wavelength of the light.

10. The distributed feedback laser device according to claim 3, wherein said light distribution control layer has a refractive index higher than the refractive index of said cladding layers.

11. The distributed feedback laser device according to claim 3, wherein said diffraction grating has a phase shift part.

12. The distributed feedback laser device according to claim 11, wherein said phase shift part of said diffraction grating is located at the center of a cavity for shifting phase of light corresponding to ¼ of a wavelength of the light.

13. The distributed feedback laser device according to claim 5, wherein said light distribution control layer has a refractive index higher than the refractive index of said cladding layers.

14. The distributed feedback laser device according to claim 5, wherein said diffraction grating has a phase shift part.

15. The distributed feedback laser device according to claim 14, wherein said phase shift part of said diffraction grating is located at the center of a cavity for shifting phase of light corresponding to ¼ of a wavelength of the light.

16. The distributed feedback laser device according to claim 6, wherein said light distribution control layer has a refractive index higher than the refractive index of said cladding layers.

17. The distributed feedback laser device according to claim 6, wherein said diffraction grating has a phase shift part.

18. The distributed feedback laser device comprising:
a semiconductor substrate; and
a plurality of semiconductor layers supported by said semiconductor substrate and including:
an active layer;
first and second cladding layers having a refractive index and located on opposite sides of said active layer;
a diffraction grating having grating bars with a refractive index different from the refractive index of said first and second cladding layers, the grating bars being disposed within one of said first and second cladding layers, and extending in a direction perpendicular to a light emission direction, at a pitch in the light emission direction; and
at least one light distribution control layer, located in one of said first second cladding layers, spaced from said grating bars, having the same composition and as said grating bars, and having a variation in composition with respect to position similar to variation in composition with position of the grating bars.

19. The distributed feedback laser device according to claim 17, wherein said phase shift part of said diffraction grating is located at the center of a cavity for shifting phase of light corresponding to ¼ of a wavelength of the light.

* * * * *